United States Patent
Negami et al.

(10) Patent No.: US 6,259,016 B1
(45) Date of Patent: Jul. 10, 2001

(54) SOLAR CELL

(75) Inventors: Takayuki Negami, Osaka; Yasuhiro Hashimoto; Shigeo Hayashi, both of Kyoto, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/515,143

(22) Filed: Feb. 29, 2000

(30) Foreign Application Priority Data

Mar. 5, 1999 (JP) .................................................. 11-058768

(51) Int. Cl.$^7$ .......................... H01L 31/072; H01L 31/04
(52) U.S. Cl. .......................... 136/265; 136/252; 136/262; 136/263; 136/264; 257/43; 257/428; 257/461; 257/464
(58) Field of Search ..................................... 136/252, 262, 136/253, 254, 265; 257/43, 428, 461, 464

(56) References Cited

U.S. PATENT DOCUMENTS

| | | |
|---|---|---|
| 3,978,510 | 8/1976 | Kasper et al. . |
| 4,016,586 * | 4/1977 | Anderson et al. .................... 136/261 |
| 4,106,951 * | 8/1978 | Masi ...................................... 136/263 |
| 4,335,266 | 6/1982 | Mickelsen et al. . |
| 4,612,411 | 9/1986 | Weiting et al. . |
| 4,687,881 | 8/1987 | Goslowsky et al. . |
| 5,078,804 | 1/1992 | Chen et al. . |
| 5,112,410 | 5/1992 | Chen . |
| 5,137,835 | 8/1992 | Karg . |
| 5,141,564 | 8/1992 | Chen et al. . |
| 5,356,839 | 10/1994 | Tuttle et al. . |
| 5,422,304 | 6/1995 | Kohiki et al. . |

(List continued on next page.)

FOREIGN PATENT DOCUMENTS

| | | |
|---|---|---|
| 863555 * | 9/1998 | (EP) . |
| 1-28967 | 1/1989 | (JP) . |
| 3-64973 | 3/1991 | (JP) . |
| 4-132233 | 5/1992 | (JP) . |
| 5-63224 | 3/1993 | (JP) . |
| 8-195501 | 7/1996 | (JP) . |
| 8-330614 | 12/1996 | (JP) . |
| 9-199741 * | 7/1997 | (JP) . |
| WO 94/07269 | 3/1994 | (WO) . |

OTHER PUBLICATIONS

Kurita et al, Proceedings of the 1st Photovoltaic Science and Engineering Conference in Japan, 1979; Japanese Journal of Applied Physics, vol. 19 (1980) Supplement, 19–2, pp. 169–172.*

Aranovich et al, J. Appl. Phys., 51(8) pp. 4260–4268, Aug. 1980.*

(List continued on next page.)

*Primary Examiner*—Alan Diamond
(74) *Attorney, Agent, or Firm*—Merchant & Gould P.C

(57) ABSTRACT

The present invention includes a substrate, a lower electrode film, a p-type semiconductor layer (a second semiconductor layer), an n-type semiconductor layer (a first semiconductor layer), an upper electrode film and an anti-reflection film, which are stacked sequentially on the substrate in this order, and an interconnection electrode formed on the upper electrode film. The first semiconductor layer is free from Cd, and the second semiconductor layer is a light-absorption layer. The band gap $Eg_1$ of the first semiconductor layer and the band gap $Eg_2$ of the second semiconductor layer satisfy a relationship: $Eg_1 > Eg_2$. The electron affinity $\chi_1$ (eV) of the first semiconductor layer and an electron affinity $\chi_2$ (eV) of the second semiconductor layer satisfy a relationship: $0 \leq (\chi_2 - \chi_1) < 0.5$.

19 Claims, 18 Drawing Sheets

U.S. PATENT DOCUMENTS

| | | |
|---|---|---|
| 5,441,897 | 8/1995 | Noufi et al. . |
| 5,474,939 | 12/1995 | Pollack et al. . |
| 5,578,503 | 11/1996 | Karg et al. . |
| 5,626,688 | 5/1997 | Probst et al. . |
| 5,843,341 | 12/1998 | Orita et al. . |
| 5,858,121 | 1/1999 | Wada et al. . |
| 5,948,176 * | 9/1999 | Ramanathan et al. ............... 136/264 |
| 5,981,868 * | 11/1999 | Kushiya et al. ..................... 136/265 |

OTHER PUBLICATIONS

Potter et al, "Device Analysis of CuInSe2/(Cd,Zn)S/ZnO Solar Cells," Conference Record, 18th IEEE Photovoltaic Specialists Conference, pp. 1659–1664, published Apr. 1986.*

Devi et al, "Photodielectric Studies in (MgO–ZnO) Mixed System," Nat. Acad. Sci. Letters, 14(11), pp. 453–457, 1991.*

Niemegeers et al. "Model for Electronic Transport in Cu(In, Ga)Se2 Solar Cells", Progress in Photovalics Research and Applications, 6, 407–421 (1998).

Schmid et al. "Solar Enerty Materials and Solar Cells", 41/42, 281–294 (1996).

Negami et al. "CIGS Solar Cells Using a Novel Window Zn1–xMgxO Film", Proc. 28th IEEE Photovalic Specialists Conf., Anchorage, Alaska, Sep. 2000, to be published.

"Prospects of Wide—gap chalcopyrites for thin film photovoltaic modules"; Herberholz, R., Nadenau, V., Ruhle, U., Koble, C., Schock, H.W., Dimmler, B., pp 227–237; Solar Energy Materials and Solar Cells 49 (1997).

"Preparation of Device—Quality Cu(In, Ga)Se$_2$ Thin Films Deposited by Coevaporation with Composition Monitor"; Naoki Kohara, Takayuki Negami, Mikihiko Nishitani and Takahiro Wada; Jpn. Appl. Phys. vol. 34 (1995) pp. L1141–L1144.

Kushiya et al., "The Role of Cu(InGa)(SeS)2 Surface Layer on a Graded Band–Gap Cu(InGa)Se2 Thin Film Solar Cell Prepared by Two–Stage Method," 25$^{th}$ IEEE PVSC, Hyatt Regency Crystal City, Washington, DC.

J. Shewchun et al. "The Application of Pentenary Alloy Compounds of the ... Variety to Photovoltaic Solar Energy Conversion" 14$^{th}$ IEEE Photovoltaic Specialists Conference, pp. 650–655.

M.L. Fearheiley "The Phase Relations in the Cu, In, Se System and the Growth of CuInSe$_2$ Single Crystals" Solar Cells, vol. 16, pp. 91–100.

H. Hallak et al. "Composition and substrate effects on the structure of thin–film CuGaSe$_2$" Applied Physics Letters, vol. 55, No. 10, pp. 981–983.

H. Neumann et al. "Relation Between Electrical Properties and Composition in CuInSe$_2$ Single Crystals" Solar Cells, vol. 28, No. 4, pp. 301–313.

A. Rockett et al. "CuInSe$_2$ for photovoltaic applications" J. Appl. Phys., vol. 70, No. 7, pp. R81–R97.

C.L. Jensen et al. "The Role of Gallium in CuInSe$_2$ Solar Cells Fabricated by a Two—Stage Method" Proceedings of the Photovoltaic Specialists Conference, pp. 577–580.

Hans–W. Schock "CuInSe$_2$ and Other Chalcopyrite–Based Solar Cells" MRS Bulletin, vol. 18, No. 10, pp. 42–44.

A.M. Gabor et al. "High Efficiency Polycrystalline Cu(In, Ga)Se$_2$–Based Solar Cells" American Institute of Physics, pp. 59–66.

J.R. Tuttle et al. "Structure, chemistry, and growth mechanisms of photovoltaic quality thin–film Cu(In,Ga)Se$_2$ grown from a mixed phase precursor" J. Appl. Phys., vol. 77, No. 1, pp. 153–161.

M. Hornung et al. "Growth of bulk Cu$_{0.85}$In$_{1.05}$Se$_2$ and characterization on a micro scale" Journal of Crystal Growth, vol. 154, pp. 315–321.

K.O. Velthaus et al., "Novel Buffer Layers for the CuInSe$_2$/Buffer/ZnO Devices", 11th E.C. Photovoltaic Solar Energy Conference, 12–16 Oct. 1992, pp. 842–845.

H.W. Schock et al., "High Efficiency Chalcopyrite Based Thin Film Solar Cells—Results of the Eurocis–Collaboration", 11th E.C. Photovoltaic Solar Energy Conference, pp. 116–119.

H.W. Bloss et al., "Thin–Film Solar Cells", Progress in Photovoltaics: Research and Applications, vol. 3, pp. 3–24.

Ji–Beom Yoo et al. "Preparation and Properties of CuInSe$_2$ Solar Cells with a ZnSe Intermediate Layer" Twentieth IEEE Photovoltaic Specialists Conference, pp. 1431–1436.

S.K. Deb "Current Status of Thin Film Solar Cell Research at Seri" Thin Solid Films, vol. 163, pp. 75–84.

A.G. Fitzgerald et al. "A microbeam analysis study of heterojunctions formed with CuInS$_2$ and CuInSe$_2$" Solar Energy Materials, vol. 22, pp. 43–61.

* cited by examiner

Al/(Zn+Al) ratio in $Zn_Y Al_{2-2Y} O_{3-2Y}$ thin film

Content ratio x of S in light-absorption layer $CuIn(Se_{1-x}S_x)_2$

SOLAR CELL

BACKGROUND OF THE INVENTION

1. Field of the Invention

The present invention relates to a solar cell, in particular, a solar cell including a compound semiconductor layer comprising at least one element from each of groups Ib, IIIb and VIb as the light-absorption layer.

2. Description of the Prior Art

CuInSe$_2$ and Cu(In, Ga)Se$_2$ are compound semiconductors (having a chalcopyrite structure) comprising at least one element from each of groups Ib, IIIb and VIb. Thin-film solar cells using a CuInSe$_2$ film (hereinafter, also referred to as a CIS film) or a Cu(In, Ga)Se$_2$ film (hereinafter, also referred to as a CIGS film) as the light-absorption layer have a high energy conversion efficiency, which does not deteriorate due to irradiation or the like. Therefore, such a thin film solar cell has received attention.

In the solar cell, theoretically, when the band gap of the light-absorption layer is in the range from 1.4 eV to 1.5 eV, the highest conversion efficiency can be obtained. In the case of the solar cell including a CIGS film, it is possible to control the band gap by changing the ratio of Ga and In. When the ratio Ga/(In+Ga) by number of atoms is in the range from 0.5 to 0.8, the band gap is 1.4 eV to 1.5 eV.

However, in the current CIGS solar cells, the highest conversion efficiency can be obtained when the band gap of the CIGS film is in the range from 1.2 eV to 1.3 eV (corresponding to the range of the ratio Ga/(In+Ga) by number of atoms from 0.2 to 0.3). In the current CIGS solar cell, contrary to the theory, even if the band gap is broadened by increasing the Ga concentration, the conversion efficiency is reduced.

The CIGS solar cell with high conversion efficiency that has been reported has a heterojunction of a CdS film as the window layer and a CIGS film as the light-absorption layer. On the other hand, in recent years, a CIGS solar cell without CdS has received attention for environmental reasons. As a result, several CIGS solar cells using a ZnO based semiconductor as the window layer instead of CdS, have been reported. However, these cells have a lower conversion efficiency than that of cells comprising the CdS film. When a ZnO based semiconductor is used as the window layer, especially the open-circuit voltage is low.

SUMMARY OF THE INVENTION

Therefore, with the foregoing in mind, it is an object of the present invention to provide a solar cell that comprises no CdS film in the semiconductor layer forming a pn junction and has a high efficiency.

In order to achieve the above-object, a first solar cell of the present invention includes a first semiconductor layer that is n-type and a second semiconductor layer that is p-type, the first and second semiconductor layers forming a pn junction, wherein the first semiconductor layer is free from Cd, the second semiconductor layer is a light-absorption layer, the band gap Eg$_1$ of the first semiconductor layer and the band gap Eg$_2$ of the second semiconductor layer satisfy the relationship: Eg$_1$>Eg$_2$, and the electron affinity $\chi_1$ (eV) of the first semiconductor layer and the electron affinity $\chi_2$ (eV) of the second semiconductor layer satisfy the relationship: $0 \leq (\chi_2-\chi_1) < 0.5$. This embodiment provides a solar cell that comprises no CdS film in the semiconductor layer forming a pn junction and has high efficiency.

In the first solar cell, it is preferable that the first semiconductor layer is formed closer to the side from which light is incident than the second semiconductor layer is. This embodiment allows loss of incident light to be reduced.

The first solar cell preferably further includes a third semiconductor layer between the first semiconductor layer and the second semiconductor layer, and it is preferable that the band gap Eg$_3$ of the third semiconductor layer and the band gap Eg$_2$ satisfy the relationship: Eg$_3$>Eg$_2$. This embodiment provides a solar cell having particularly high efficiency.

In the first solar cell, it is preferable that the third semiconductor layer is made of a semiconductor selected from the group consisting of an n-type semiconductor and a highly resistive semiconductor. This embodiment can reduce damage to the second semiconductor layer in the process of forming the first semiconductor layer and provides a satisfactory pn junction, so that a solar cell having particularly high efficiency can be obtained.

In the first solar cell, it is preferable that the electron affinity $\chi_3$ (eV) of the third semiconductor layer and the electron affinity $\chi_2$ satisfy the relationship: $(\chi_2-\chi_3) \geq 0.5$, and the thickness of the third semiconductor layer is not more than 50 nm. This embodiment provides a solar cell having a high conversion efficiency, because carriers tunnel through the third semiconductor layer and are transported.

In the first solar cell, it is preferable that the third semiconductor layer comprises an oxide comprising Zn and at least one element selected from group IIIb or a chalcogenide comprising Zn and at least one element selected from group IIIb.

The first solar cell preferably further includes an insulating layer between the first semiconductor layer and the second semiconductor layer, and it is preferable that the band gap Eg$_{INS}$ of the insulating layer and the band gap Eg$_2$ satisfy the relationship Eg$_{INS}$>Eg$_2$. This embodiment provides a solar cell having a particularly high efficiency.

In the first solar cell, it is preferable that the electron affinity $\chi_{INS}$(eV) of the insulating layer and the electron affinity $\chi_2$ satisfy the relationship: $(\chi_2-\chi_{INS}) \geq 0.5$, and the thickness of the insulating layer is not more than 50 nm. This embodiment provides a solar cell having a high conversion efficiency, because carriers tunnel through the third semiconductor layer and are transported.

In the first solar cell, it is preferable that the insulating layer is made of at least one insulator selected from Al$_2$O$_3$, Ga$_2$O$_3$, Si$_3$N$_4$, SiO$_2$, MgF$_2$ and Mgo.

In the first solar cell, it is preferable that the second semiconductor layer further includes an n-type semiconductor layer or a highly resistive semiconductor layer on the surface thereof on the side of the first semiconductor layer. This embodiment provides a solar cell having a high conversion efficiency, because the pn junction is formed in the second semiconductor layer so that the defect density at the junction interface can be reduced.

In the first solar cell, it is preferable that the second semiconductor layer is a compound semiconductor layer comprising at least one element from each of groups Ib, IIIb, and VIb. This embodiment provides a solar cell including a compound semiconductor of a chalcopyrite structure having less light-induced degradation as the light-absorption layer. Throughout this specification, "groups Ib, IIIb, VIb, and IIa" refer to "groups 1B, 3B, 6B and 2A" of the periodic table of elements according to the old IUPAC recommendation before 1985.

In the first solar cell, it is preferable that the first semiconductor layer is made of a compound comprising Zn. This embodiment provides a solar cell that is free from CdS in the semiconductor layer forming the pn junction and has a particularly high conversion efficiency.

In the first solar cell, it is preferable that the compound of the first semiconductor layer is an oxide comprising Zn and at least one element selected from group IIa, or a chalcogenide comprising Zn and at least one element selected from group IIa.

In the first solar cell, it is preferable that the compound of the first semiconductor layer comprises an oxide expressed by a general formula $Zn_{1-x}A_xO$ (where element A is at least one selected from Be, Mg, Ca, Sr and Ba, and $0<X<1$) as the main component. This embodiment allows the electron affinity of the first semiconductor layer to be changed by changing the element A and X depending on the second semiconductor layer and thus provides a solar cell having a particularly high conversion efficiency.

In the first solar cell, it is preferable that the element A is Mg, and the X satisfies the relationship: $0<X<0.5$. This embodiment provides a solar cell having even higher characteristics.

In the first solar cell, it is preferable that the compound of the first semiconductor layer is an oxide comprising Zn and at least one element selected from group IIIb or a chalcogenide comprising Zn and at least one element selected from group IIIb. This embodiment provides a solar cell that is free from CdS in the semiconductor layer forming the pn junction and has a particularly high conversion efficiency.

In the first solar cell, it is preferable that the compound of the first semiconductor layer comprises an oxide expressed by a general formula $Zn_YB_{2-2Y}O_{3-2Y}$ (where element B is at least one selected from Al, Ga and In, and $0<Y<1$) as the main component. This embodiment allows the electron affinity of the first semiconductor layer to be changed by changing the element A and Y depending on the second semiconductor layer and thus provides a solar cell having a particularly high conversion efficiency.

A second solar cell includes a p-type light-absorption layer and an n-type semiconductor layer stacked over the light-absorption layer, wherein the semiconductor layer comprises an oxide expressed by a general formula $Zn_{1-Z}C_ZO$ (where element C is at least one selected from Be, Mg, Ca, Sr and Ba, and $0<Z<1$) as the main component. In the second solar cell, there are few defects in the semiconductor layer that functions as the window layer, and the band gap of the window layer can be changed as desired, so that a solar cell having a high conversion efficiency can be obtained.

In the second solar cell, it is preferable that the element C is Mg, and the Z satisfies the relationship: $0<Z<0.5$.

As described above, the first solar cell of the present invention can be provided with high conversion efficiency by defining the relationship with respect to the band gap and the electron affinity between the first semiconductor layer (window layer) and the second semiconductor layer (light-absorption layer). By using the window layer having an electron affinity in the above range, recombination at the junction interface can be suppressed, and the window layer and the light-absorption layer do not become barriers against photoexcited carriers. Furthermore, the first solar cell is provided with high conversion efficiency without using CdS as the window layer.

The second solar cell of the present invention comprises an oxide expressed by a general formula $Zn_{1-z}C_zO$ (where element C is at least one element selected from the group consisting of Be, Mg, Ca, Sr and Ba, and $0<Z<1$) as the main component. Therefore, there are few defects in the window layer, and the band gap and the electron affinity of the window layer can be changed as desired. Consequently, a solar cell with high conversion efficiency can be obtained.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described with reference to the accompanying drawings.

Embodiment 1

In Embodiment 1, an example of a solar cell of the present invention will be described. The example of the solar cell in Embodiment 1 generates photovoltaic power by light incident from the side opposite to the substrate.

Figure 1:
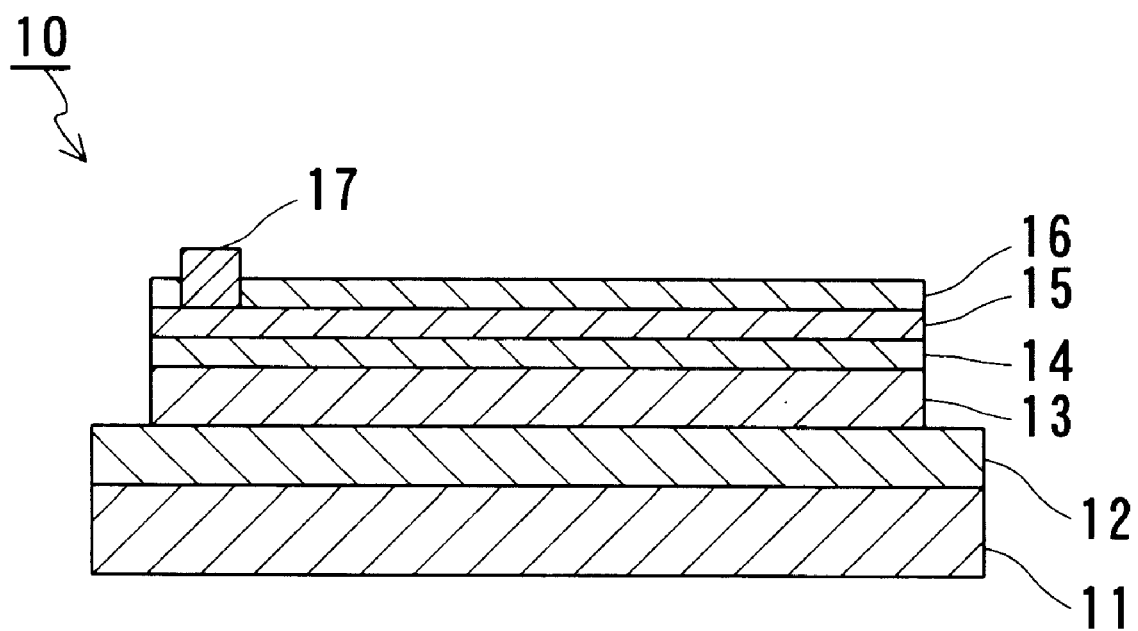
FIG. 1 is a cross-sectional view illustrating an example of a solar cell of the present invention.

FIG. 1 is a cross-sectional view of the solar cell of Embodiment 1. Referring to FIG. 1, a solar cell 10 of Embodiment 1 includes a substrate 11, a lower electrode film 12, a semiconductor layer 13 (a second semiconductor layer), a semiconductor layer 14 (a first semiconductor layer), an upper electrode film 15 and an anti-reflection film 16, which are stacked sequentially on the substrate 11 in this order, and an interconnection electrode 17 formed on the upper electrode film 15. In order words, the semiconductor layer 14 is provided closer to the side from which light is incident than the semiconductor layer 13 is.

For the substrate 11, for example, glass, stainless steel, a polyimide film can be used.

For the lower electrode film 12, for example, a metal film comprising Mo can be used.

Figure 2:
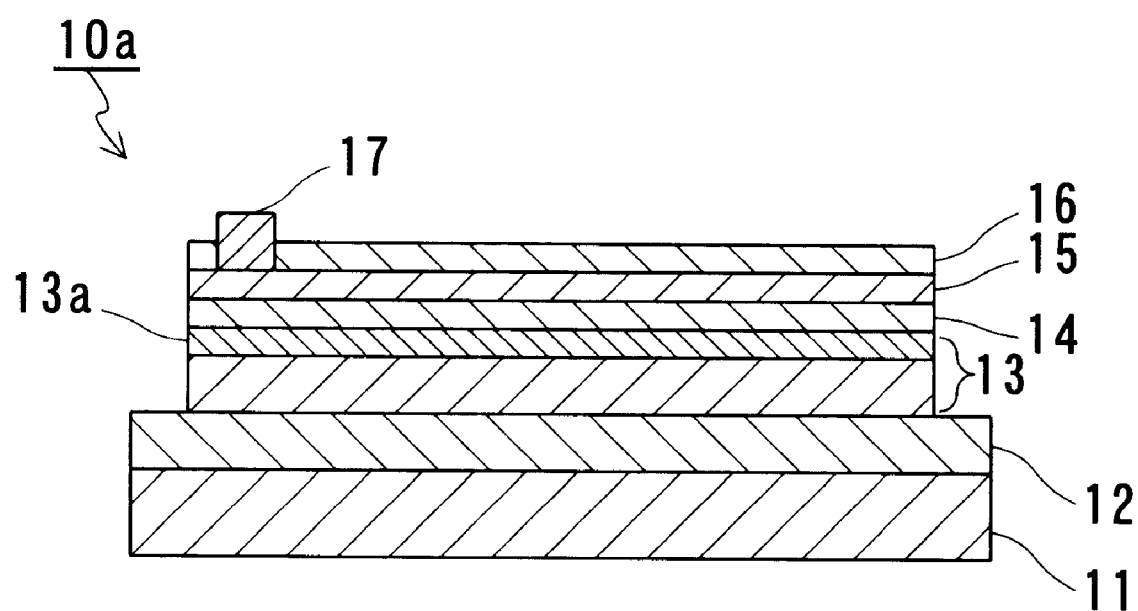
FIG. 2 is a cross-sectional view illustrating another example of a solar cell of the present invention.

The semiconductor layer 13 (second semiconductor layer) is a p-type semiconductor layer that functions as a light-absorption layer. The semiconductor layer 13 is provided closer to the back surface than the semiconductor layer 14 is. For the semiconductor layer 13, for example, a compound semiconductor layer comprising at least one element from each of groups Ib, IIIb, and VIb can be used. For example, $CuInSe_2$, $Cu(In, Ga)Se_2$, $CuInS_2$, $Cu(In, Ga)S_2$ or the like can be used. The semiconductor layer 13 can be provided with a surface semiconductor layer 13a on the surface on the side of the semiconductor layer 14 (which also applies to the following embodiments). FIG. 2 is a cross-sectional view of a solar cell 10a comprising the surface semiconductor layer 13a. The surface semiconductor layer 13a is an n-type semiconductor layer or a highly resistive semiconductor layer (having a resistivity of $10^4$ Ωcm or more). Examples of highly resistive semiconductor layers include $CuIn_3Se_5$ and $Cu(In, Ga)_3Se_5$.

The semiconductor layer 14 (first semiconductor layer) forms a pn junction with the semiconductor layer 13, and functions as a window layer. The semiconductor layer 14 is an n-type semiconductor layer. The semiconductor layer 14 is substantially free from Cd (Cd is not contained as a constituent element or a dopant). A compound comprising Zn, for example, can be used for the semiconductor layer 14. For example, an oxide or chalcogenide comprising Zn and at least one element selected from group IIa, or an oxide or chalcogenide comprising Zn and at least one element selected from group IIIb can be used as the compound comprising Zn. More specifically, a compound comprising an oxide expressed by a general formula $Zn_{1-x}A_xO$ (where element A is at least one selected from Be, Mg, Ca, Sr and Ba, and $0<X<1$) as the main component (in a content of 90wt % or more) can be used. In this case, it is preferable that the content of the element A is 0.1 at % or more. Alternatively, a compound comprising an oxide expressed by a general formula $Zn_YB_{2-2Y}O_{3-2Y}$ (where element B is at least one selected from Al, Ga and In, and $0<Y<1$) as the main component (in a content of 90 wt % or more) also can be used. In this case, it is preferable that the content of the element B is 5 at % or more.

In the solar cell 10 of Embodiment 1, the band gap $Eg_2$ of the semiconductor layer 13 and the band gap $Eg_1$ of the semiconductor layer 14 satisfy the relationship $Eg_1>Eg_2$. The electron affinity $\chi_2$ (eV) of the semiconductor layer 13 and the electron affinity $\chi_1$ (eV) of the semiconductor layer 14 satisfy the relationship $0 \leq (\chi_2-\chi_1)<0.5$.

The upper electrode film 15 is a transparent conductive film, and for example, ZnO:Al where ZnO is doped with Al, or ITO (indium tin oxide) can be used for the upper electrode film 15.

The anti-reflection film 16 is a film that prevents incident light from being reflected at the interface of the upper electrode film 15. In the case where the upper electrode film 15 is ITO or ZnO:Al, for example, $MgF_2$ can be used for the anti-reflection film 16.

For the interconnection electrode 17, a metal film comprising a laminate of a NiCr film and an Au film can be used.

Next, an example of a method for producing the solar cell 10 will be described.

First, the upper electrode film 12 is formed on the substrate 11, for example by sputtering or vapor deposition. Therefore, the semiconductor layer 13 is formed on the upper electrode film 12, for example by sputtering or vapor deposition. Then, the semiconductor layer 14 is formed on the semiconductor layer 13, for example by chemical bath deposition or sputtering. Then, the upper electrode film 15 is formed on the semiconductor layer 14, for example by sputtering. Then, the interconnection electrode 17 is formed on a portion of the upper electrode film 15, for example, by electron beam evaporation. Then, the anti-reflection film 16 is formed on the upper electrode film 15, for example by vapor deposition. In this manner, the solar cell 10 can be formed. In the case where an n-type semiconductor layer or a highly resistive semiconductor layer is formed on the surface of the semiconductor layer 13, they can be formed, for example by a solution-immersion, vapor deposition or gaseous diffusion method.

Figure 3:
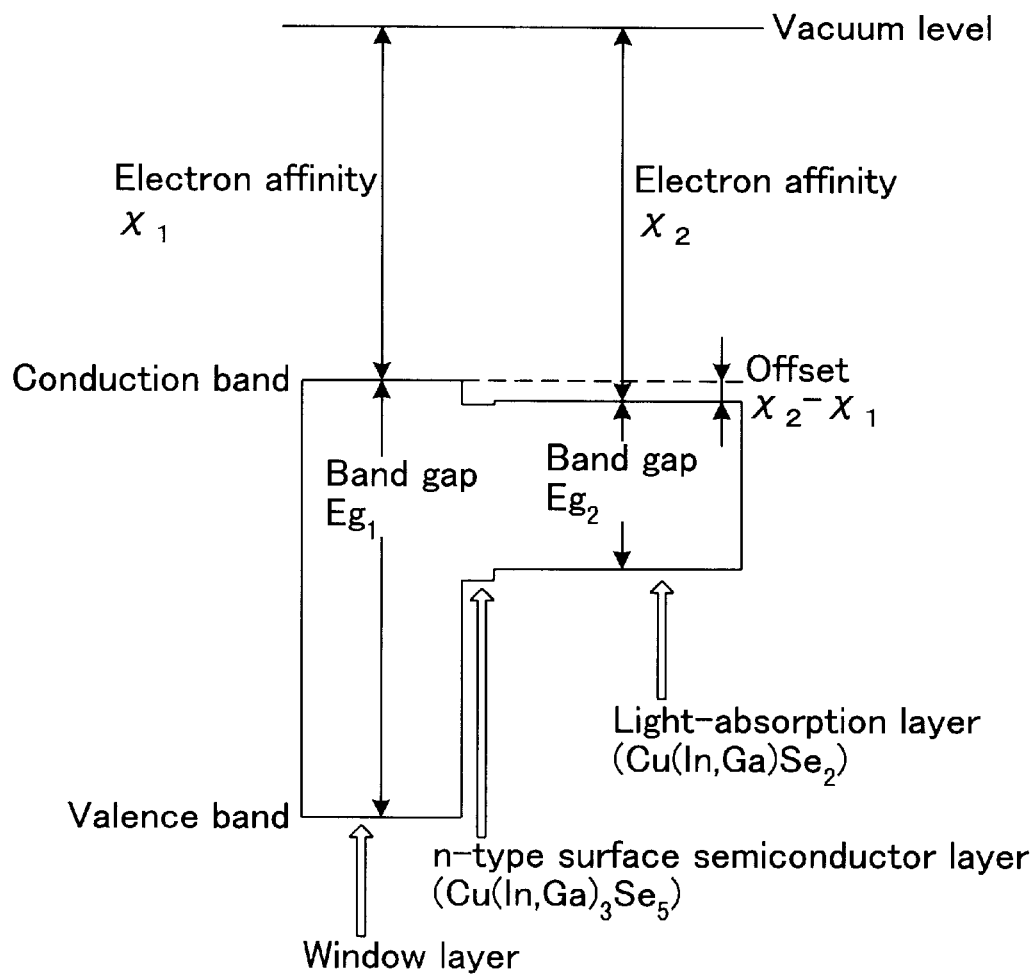
FIG. 3 is a schematic band diagram of an example of the solar cell shown in FIG. 1.

FIG. 3 is a schematic band diagram of an example of the solar cell 10. In the example of FIG. 3, the semiconductor layer 13 is made of $Cu(In, Ga)Se_2$, and the surface semiconductor layer 13a made of $Cu(In, Ga)_3Se_5$ is formed on the surface of the semiconductor layer 13.

Next, the functions of the solar cell 10 will be described by taking a solar cell using a CIGS film for the semiconductor layer 13, which is a light-absorption layer.

Figure 4A:
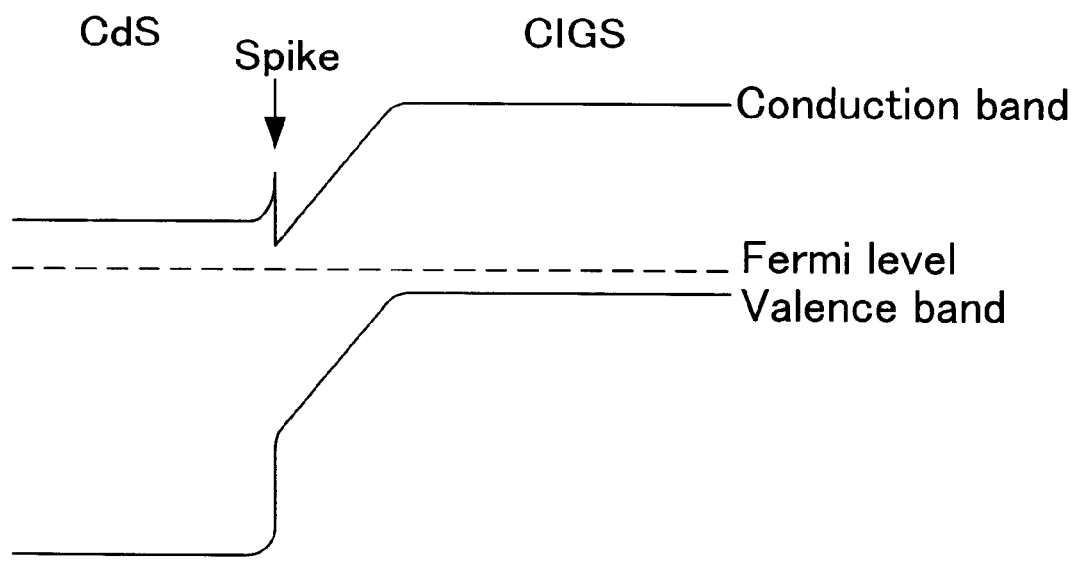
FIGS. 4A and 4B are schematic band diagrams of examples of conventional solar cells.
Figure 4B:
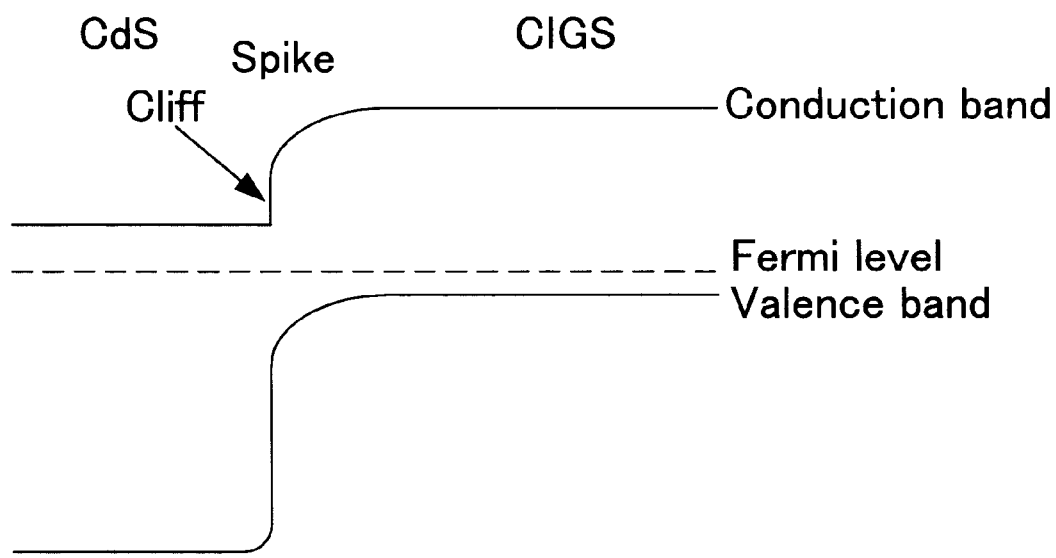

In order to improve the efficiency of the solar cell using a CIGS film for the light-absorption layer, it is effective to enlarge the band gap of the CIGS film. However, in a conventional solar cell provided with a window layer made of CdS, when the band gap of the CIGS film is broadened to 1.3 eV or more, contrary to the theory, the efficiency is reduced. This may be caused partly by the energy difference (offset) in the conduction band at the heterojunction between the CIGS film as the light-absorption layer and the CdS film as the window layer. E. Herberholz et al. has put forward the following model (Solar Energy Materials and Solar Cells, p.227, vol.49, no. 3, published in 1997). In the case where the ratio {Ga/(In+Ga)} by number of atoms in the CIGS film is lower than 0.5, the band discontinuity caused due to the offset of the conduction band between the CdS film and the CIGS film is in a spike-like form, where the conduction band of the CdS film is raised and is projected in the vicinity of the junction. In the case where the ratio {Ga/(In+Ga)} by number of atoms is higher than 0.5, the band discontinuity is in a cliff-like form, where the conduction band of the CIGS film is raised, and a step is generated between the conduction band of the CdS and the conduction band of CIGS. FIG. 4A is the band diagram when the offset between CdS and CIGS is spike-like, and FIG. 4B is the band diagram when the offset between CdS and CIGS is cliff-like. This model suggests that when the band discontinuity of the conduction band is cliff-like, recombination increases at the heterojunction interface and in the vicinity of the interface, thus reducing the conversion efficiency. Similarly, in the case where the band gap of the CIGS film is 1.2 eV–1.3 eV, it is expected that when the CdS film as the window layer is replaced by a ZnO film, the band discontinuity of the conduction bands of the ZnO film and the CIGS film is cliff-like where the conduction band of the CIGS film is raised.

Such a band discontinuity of the conduction band of the heterojunction results from the difference in the electron affinity between the window layer and the CIGS film as the light-absorption layer. In general, with respect to an n-type semiconductor and p-type semiconductor having different band gaps, in the case of $\chi_n < \chi_p$, where $\chi_n$ is the electron affinity of the n-type semiconductor and $\chi_p$ is the electron affinity of the p-type semiconductor, the discontinuity of the conduction bands is spike-like. On the other hand, in the case of $\chi_n > \chi_p$, the discontinuity of the conduction bands is cliff-like. When the electron affinity is compared between a $CuInSe_2$ film free from Ga and the CdS film, the electron affinity of the CdS film is smaller by about 0.2 eV to 0.3 eV. Therefore, when a heterojunction is formed, a spike is generated on the side of CdS. However, the electron affinity of CIGS decreases with increasing Ga concentration. Consequently, when the Ga concentration exceeds a certain level, the electron affinity of CIGS becomes smaller than that of CdS, so that, when a heterojunction is formed, a cliff is generated on the side of CIGS.

Furthermore, the form of the band discontinuity of the window layer and the CIGS film also is determined by the electron affinities of the window layer and the CIGS film. When the CdS film and the ZnO film are compared as the window layer, since the electron affinity of ZnO is about 0.4 eV larger than that of CdS, a cliff is generated when a heterojunction is formed even with a $CuInSe_2$ film free from Ga, which may lead to a loss.

In the case where the electron affinity of the window layer is smaller than that of the light-absorption layer so that a spike is generated in the conduction band, the energy difference in the conduction bands is large so that it affects the conversion efficiency of the solar cell. The energy difference between CdS and CIGS is about 0.2 eV to 0.3 eV, which does not substantially form a barrier against carrier transport. However, for example, when ZnS is used as the window layer, the energy difference with the CIGS is about 1.6 eV, which forms a barrier for photoexcited carriers. In this case, carrier transport is prevented, so that photocurrent is not substantially accessible from outside. Therefore, the conversion efficiency is reduced. Thus, when a spike is generated in the conduction bands of the window layer and the light-absorption layer, there is an optimal range of the energy difference (offset) that can provide a high efficiency. In view of the above-described optimal ranges, the electron affinities and the band gaps of the semiconductor layer 13 (light-absorption layer) and the semiconductor layer 14 (window layer) are defined for the solar cell 10 of Embodiment 1. Therefore, the solar cell 10 of Embodiment 1 has little recombination of carriers at the junction interface between the semiconductor layer 13 and the semiconductor layer 14.

As described above, according to the solar cell 10 of the Embodiment 1, a solar cell with high efficiency can be obtained without using CdS for the window layer. In this embodiment, the first semiconductor layer is provided closer to the side from which light is incident than the second semiconductor layer is. However, the first semiconductor layer can be provided closer to the back surface than the second semiconductor layer is.

Embodiment 2

Another example of the solar cell of the present invention will be described in Embodiment 2.

Figure 5:
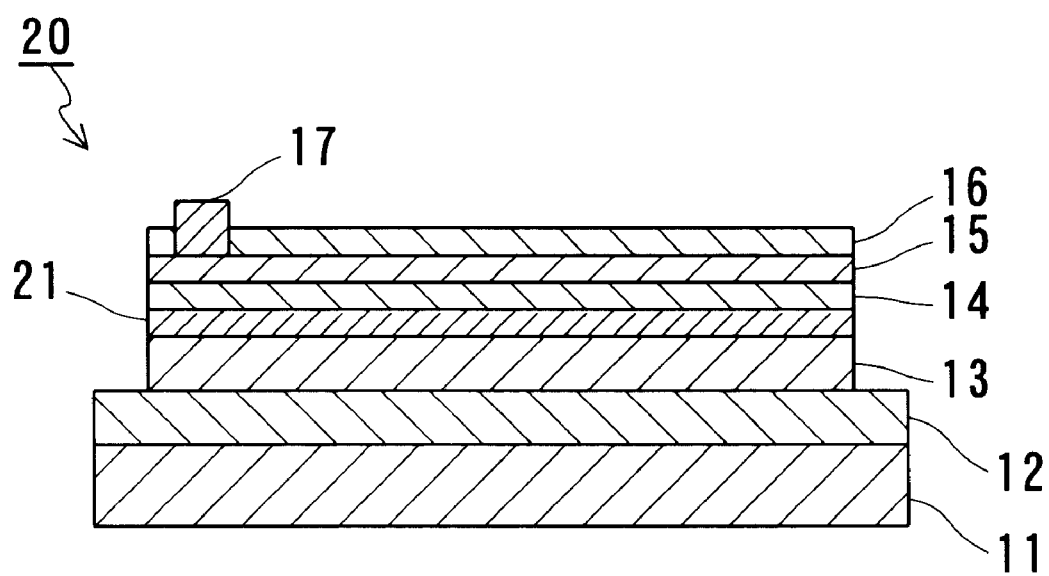
FIG. 5 is a cross-sectional view illustrating another example of a solar cell of the present invention.

FIG. 5 is a cross-sectional view of a solar cell 20 of Embodiment 2. The solar cell 20 of Embodiment 2 is different from the solar cell 10 of Embodiment 1 in that a semiconductor layer 21 is provided in Embodiment 2. A duplicated description will be omitted.

The semiconductor layer 21 (third semiconductor layer) is provided between the semiconductor layer 13 and the semiconductor layer 14. The band gap $Eg_3$ of the semiconductor layer 21 and the band gap $Eg_2$ of the semiconductor layer 13 satisfy the relationship $Eg_3 > Eg_2$. An oxide comprising Zn and at least one element selected from group IIIb or a chalcogenide comprising Zn and at least one element selected from group IIIb, for example, can be used as the third semiconductor layer. Alternatively, $SnO_2$ can be used as the semiconductor layer 21.

It is preferable that the electron affinity $\chi_3$ (eV) of the semiconductor layer 21 and the electron affinity $\chi_2$ (eV) of the semiconductor layer 13 satisfy the relationship $(\chi_2 - \chi_3) \geq 0.5$. Furthermore, it is preferable that the thickness of the semiconductor layer 21 is 50 nm or less. A Zn(O, S) film can be used as the semiconductor layer 21. Herein, Zn(O, S) refers to a compound that substantially contains Zn, O and S and comprises Zn—O bonds and Zn—S bonds.

The solar cell 20 can be produced by the same method as the solar cell 10 of Embodiment 1. The semiconductor layer 21 can be formed, for example by chemical bath deposition or vapor deposition.

According to the solar cell 20 of the Embodiment 2, a solar cell with high efficiency can be obtained without using CdS for the window layer.

Embodiment 3

Another example of the solar cell of the present invention will be described in Embodiment 3.

Figure 6:
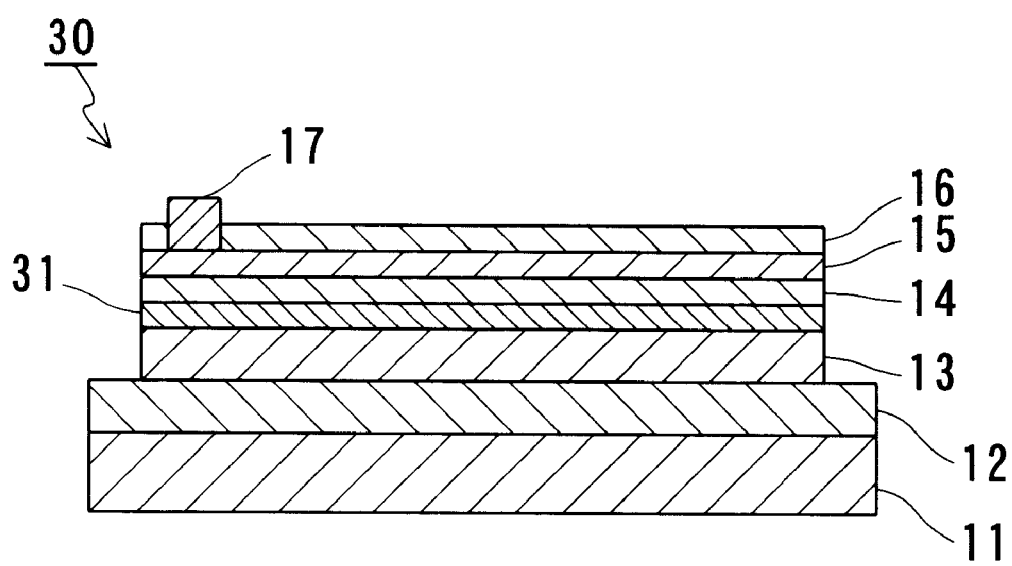
FIG. 6 is a cross-sectional view illustrating still another example of a solar cell of the present invention.

FIG. 6 is a cross-sectional view of a solar cell 30 of Embodiment 3. The solar cell 30 of Embodiment 3 is different from the solar cell 10 of Embodiment 1 in that an insulating layer 31 is provided in Embodiment 3. A duplicated description will be omitted.

The band gap $Eg_{INS}$ of the insulating layer 31 and the band gap $Eg_2$ of the semiconductor layer 13 satisfy the relationship $Eg_{INS} > Eg_2$. An insulating layer made of at least one insulator selected from $Al_2O_3$, $Ga_2O_3$, $Si_3N_4$, $SiO_2$, $MgF_2$ and MgO, for example, can be used as the insulating layer 31.

It is preferable that the electron affinity $\chi_{INS}$ of the insulating layer 31 and the electron affinity $\chi_2$ of the semiconductor layer 13 satisfy the relationship $(\chi_2 - \chi_{INS}) \geq 0.5$. Furthermore, it is preferable that the thickness of the insulating layer 31 is 50 nm or less.

The solar cell 30 can be produced by the same method as the solar cell 10 of Embodiment 1. The insulating layer 31 can be formed, for example by sputtering or vapor deposition.

According to the solar cell 30 of the Embodiment 3, a solar cell with high efficiency can be obtained without using CdS for the window layer.

EXAMPLES

Example 1

In Example 1, an example of the solar cell characteristics of the solar cell 10a of Embodiment 1 calculated with varied offsets of the conduction band between the semiconductor layers 13 and 14 will be described. The band structure of the solar cell used for the calculation is the same as that shown in FIG. 3.

In the calculation of Example 1, a Cu(In, Ga)$Se_2$ film (CIGS film) having a band gap $Eg_2$ of 1.2 eV and an electron affinity of $\chi_2$ was used as the semiconductor layer 13, which is the light-absorption layer. The calculation was performed as to the case where a Cu(In, Ga)$_3$Se$_5$ layer as the surface semiconductor layer 13a was formed on the surface of the CIGS film. A semiconductor layer having a band gap (about 3.2 eV) substantially equal to that of ZnO and an electron affinity of $\chi_1$ was used as the semiconductor layer 14, which is the window layer. The thickness of the CIGS film is 2 μm, the Cu(In, Ga)$_3$Se$_5$ layer, which is the surface semiconductor layer, is 20 nm thick, and the window layer is 0.1 μm thick.

In order to examine the influence of the offset ($\chi_2-\chi_1$) between the conduction band of the semiconductor layer 13 and the conduction band of the semiconductor layer 14, the solar cell characteristics were calculated while changing the difference in the electron affinity between the semiconductor layer 13 and the semiconductor layer 14. In the calculation, it is assumed that defects are present at the interface between the Cu(In, Ga)$_3$Se$_5$ layer, which is the surface semiconductor layer 13a, and the semiconductor layer 14, and recombination occurs in the defects.

Figure 7A:
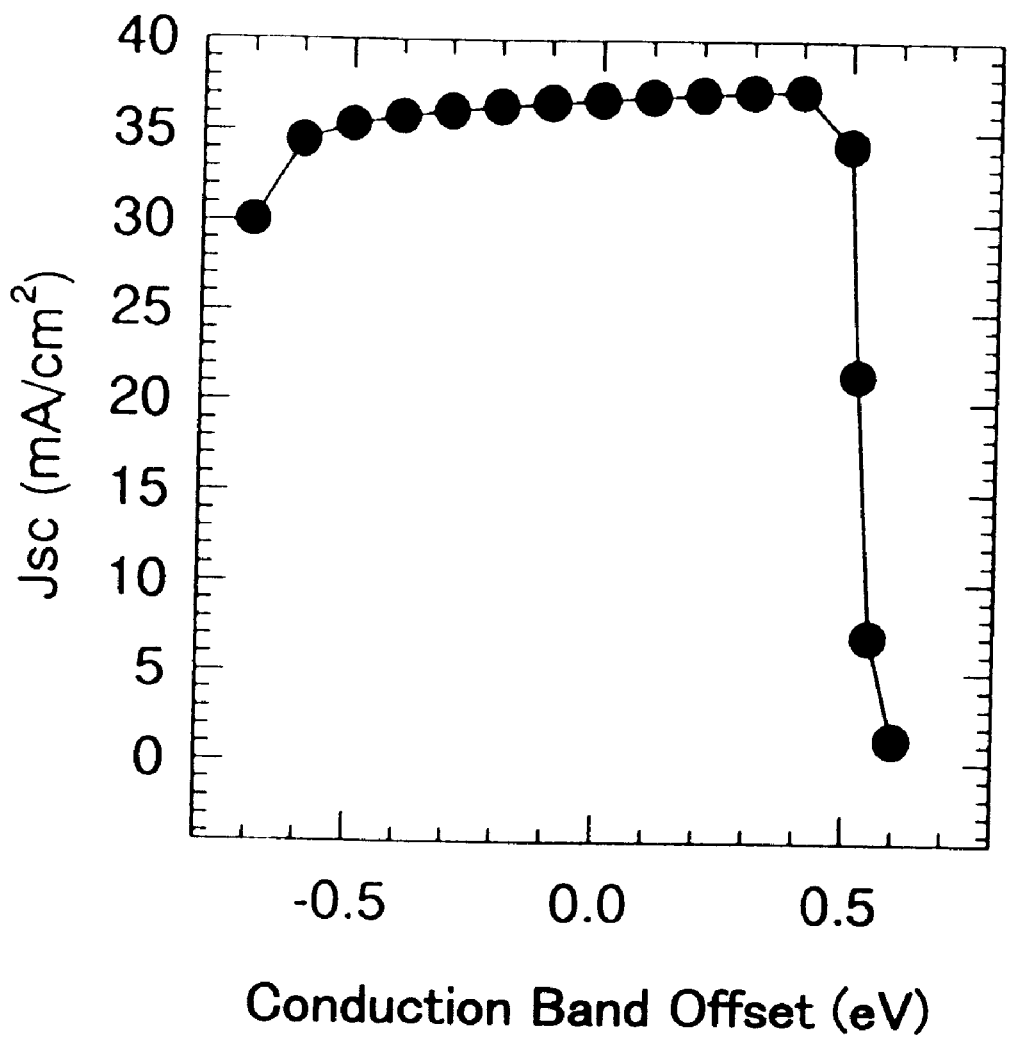
FIG. 7A is a graph showing the short-circuit current density of an example of the solar cell of the present invention.
Figure 7B:
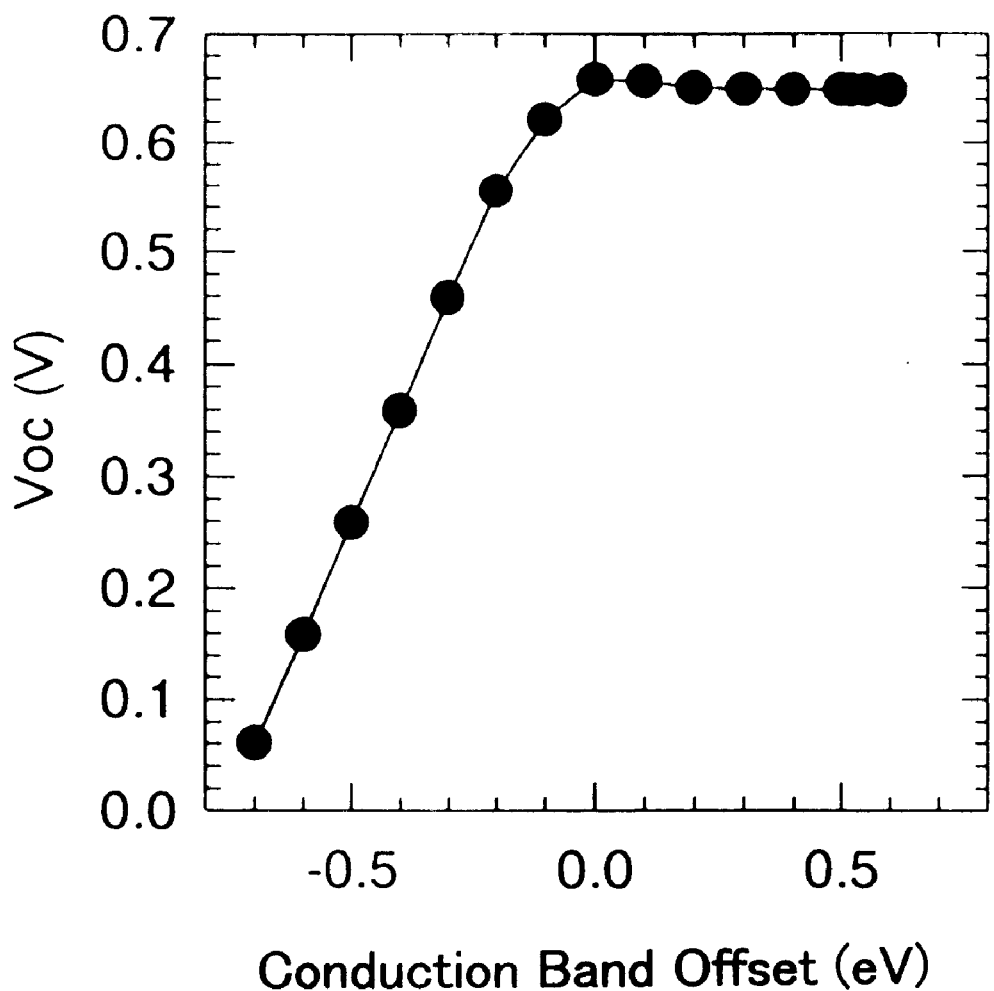
FIG. 7B is a graph showing the open-circuit voltage thereof.
Figure 8A:
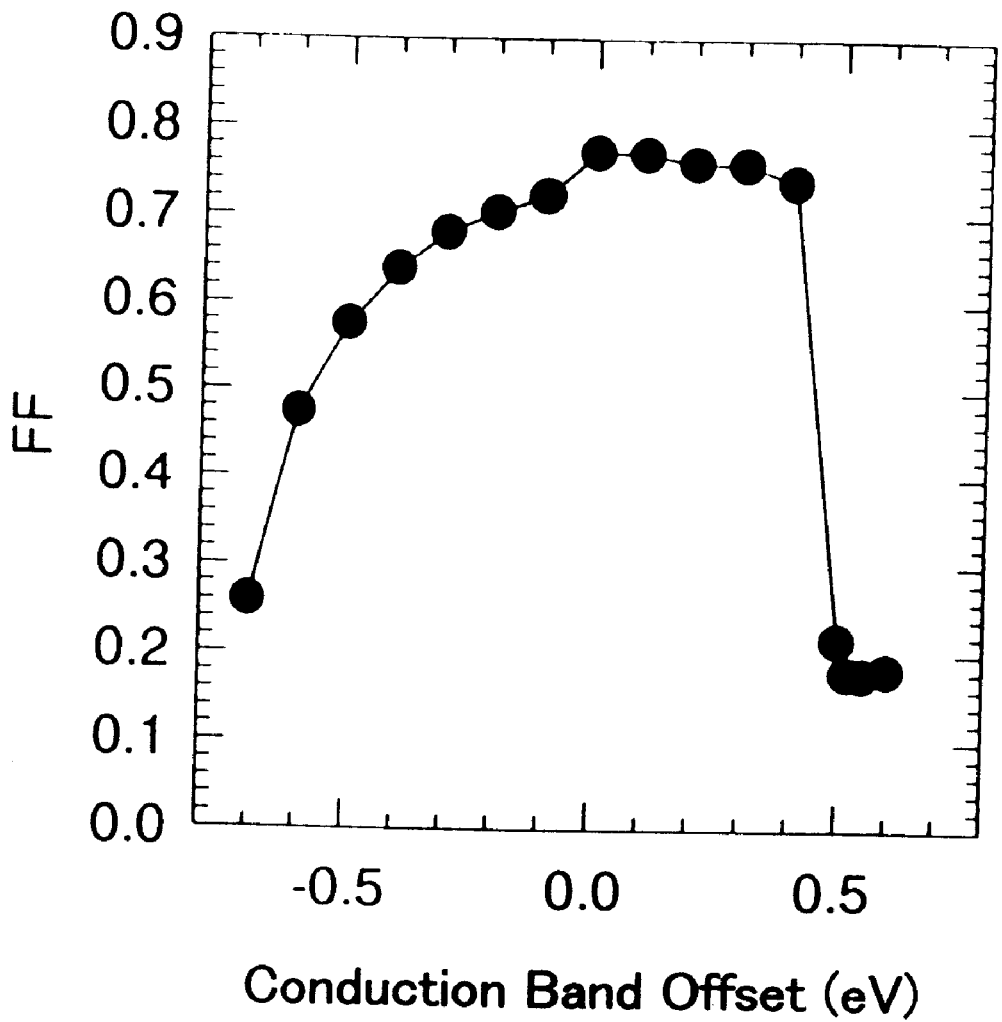
FIG. 8A is a graph showing the fill factor of an example of the solar cell of the present invention.
Figure 8B:
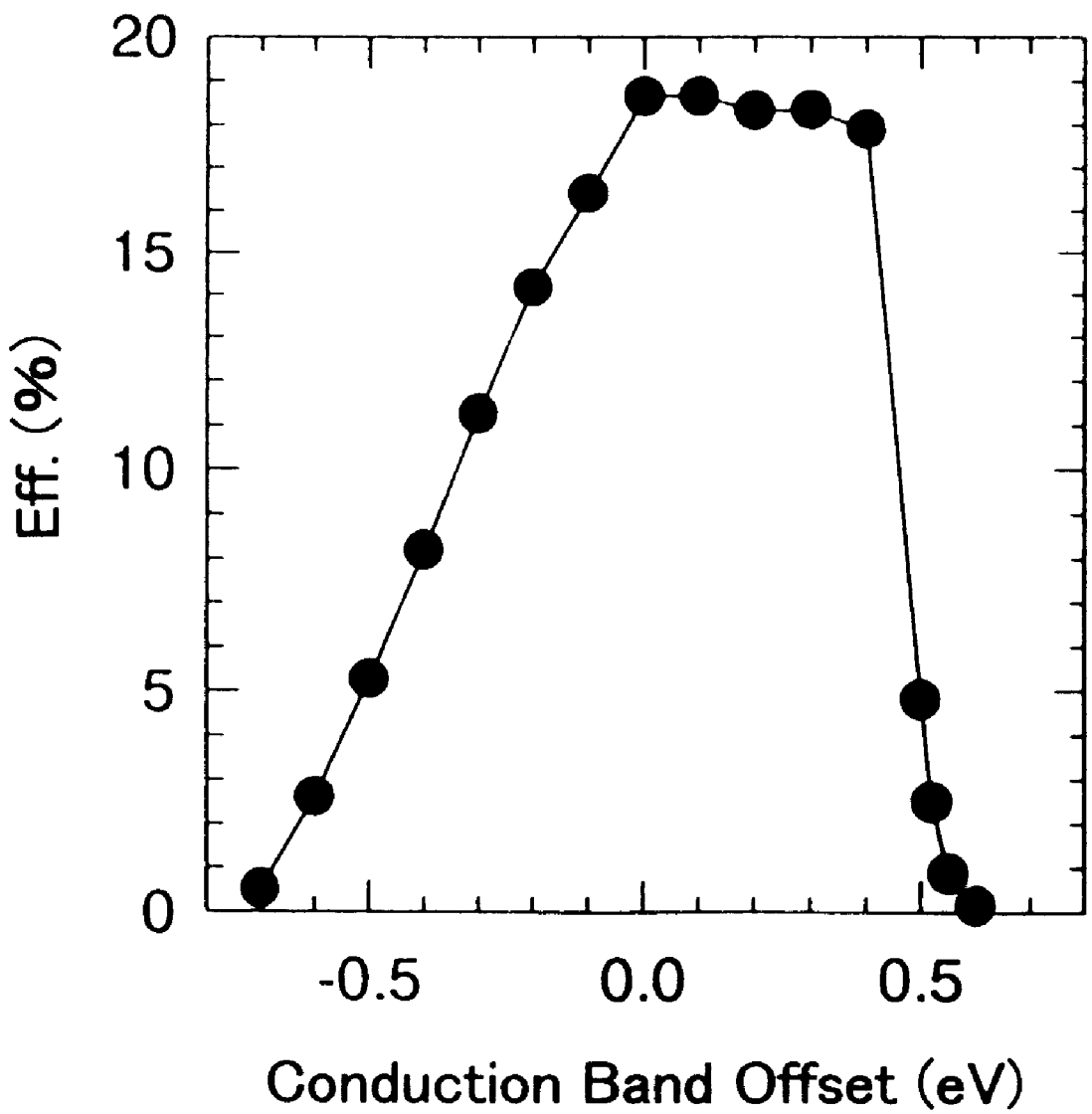
FIG. 8B is a graph showing the conversion efficiency thereof.

FIGS. 7 and 8 show the results of the calculation. FIG. 7A shows the short-circuit current density ($J_{SC}$), FIG. 7B shows the open-circuit voltage ($V_{OC}$), FIG. 8A shows the fill factor (FF), and FIG. 8B shows the conversion efficiency (Eff.).

First, when the conduction band offset is negative, namely, the electron affinity of the window layer is larger than that of the CIGS film, $J_{SC}$ decreases gradually with increasing offset in the negative direction, but the decrease rate is small. On the other hand, $V_{OC}$ and FF decrease sharply with increasing offset in the negative direction. This is because when the offset is negative, injected carriers stay at the interface between the window layer and the light-absorption layer for a longer time, so that recombination via defects present at the interface increases. When the offset is positive, namely, the electron affinity of the window layer is smaller than that of the light-absorption layer, $V_{OC}$ decreases slightly with increasing offset. On the other hand, $J_{SC}$ and FF decrease sharply when the offset is 0.5 eV or more. This is because when the offset is 0.5 eV or more, the window layer becomes a barrier against transport of photo-excited electrons so that electrons stop flowing. In conclusion, a solar cell having high characteristics can be obtained by setting the offset between the conduction band of the window layer and the conduction band of the light-absorption layer to 0.5 eV or less.

Here, the offset of the conduction band between an actually usable material for the window layer and the CIGS film will be examined. In the case where a CdS film is used for the window layer, the offset is 0.2 eV to 0.3 eV, which is in the range that achieves a high conversion efficiency. On the other hand, in the case where ZnO is used for the window layer, the offset is about -0.2 eV. In this case, the conversion efficiency is reduced to about 70% of the case where the CdS is used.

What is important here is not the absolute value of the electron affinity of the light-absorption layer or the electron affinity of the window layer, but the difference therebetween. Therefore, in order to form a solar cell with high conversion efficiency, it is necessary to select a window layer having an electron affinity $\chi_1$ satisfying $0 \leq (\chi_2-\chi_1) < 0.5$ (preferably $0 \leq (\chi_2-\chi_1) \leq 0.4$) with respect to the light-absorption layer having an electron affinity $\chi_2$ (eV). For example, when the Ga concentration of the CIGS film is changed, the band gap increases, and the electron affinity decreases.

Therefore, a solar cell with a high efficiency can be obtained by using a window layer having an electron affinity difference within the range from 0 to 0.5 eV even with respect to the CIGS film having a band gap that allows the most efficient conversion from solar light to electric energy.

In this example, the CIGS film on the surface of which a thin n-type Cu(In, Ga)$_3$Se$_5$ layer was formed was used as the p-type semiconductor for the light-absorption layer. However, the same results were obtained with a p-type CIGS film that was coated with an n-type CIGS or a p-type CIGS film whose surface was covered with a highly resistive Cu(In, Ga)S$_2$ layer.

Example 2

In Example 2, first, a method for producing the Zn$_{1-x}$Mg$_x$O film, which is formed as the semiconductor layer 14 (window layer), and the characteristics thereof will be described. The Zn$_{1-x}$Mg$_x$O film was formed by cosputtering from two targets of ZnO and MgO. The composition ratio of the Zn and Mg was controlled by changing the high frequency power applied to the two targets. The measurement of the produced Zn$_{1-x}$Mg$_x$O film by X ray diffraction revealed that the crystals were oriented significantly to the c axis and were in monophase until X was 0.3 (Zn$_{0.7}$Mg$_{0.3}$O), and diffraction based on the structure of ZnO was observed significantly until X was 0.5 (Zn$_{0.5}$Mg$_{0.5}$O) In the case where an electronic device is to be formed, in general, it is advantageous to use a monophase semiconductor or dielectric, because current loss or voltage loss is small. Therefore, a preferable range of X is 0<X<0.5 in the composition ratio when the Zn$_{1-x}$Mg$_x$O film is used in an electronic device.

Figure 9:
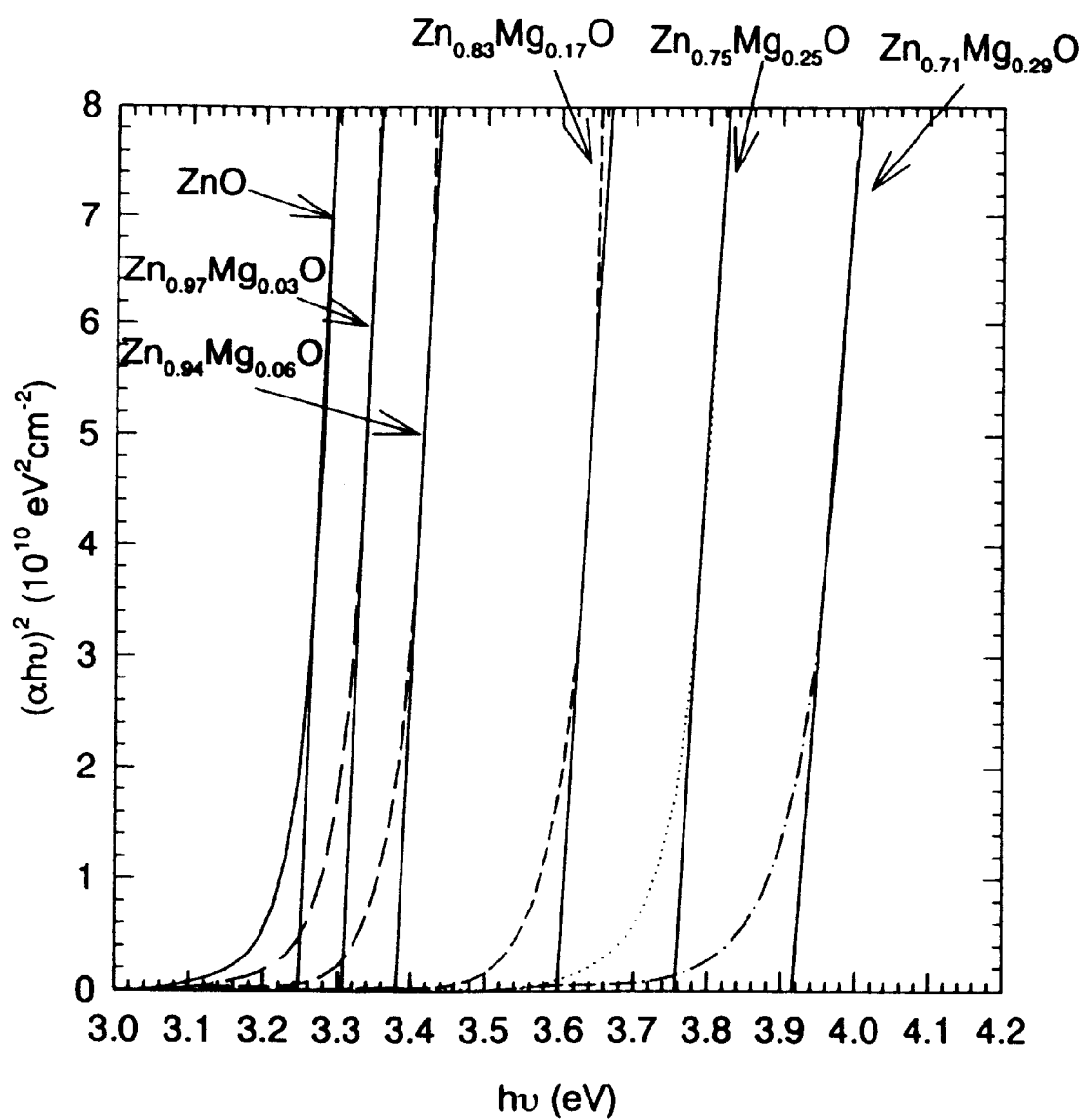
FIG. 9 is a graph showing the relationship between the light optical-absorption coefficient and the photon energy with respect to $Zn_{1-x}Mg_xO$ films having different composition ratios.

Next, the relationship between the optical-absorption coefficient and the photon energy was calculated by measuring the transmittance of the Zn$_{1-x}$Mg$_x$O films having different composition ratios. FIG. 9 shows the results of the calculation. In FIG. 9, υ represents the frequency of incident light, and α represents the optical-absorption coefficient. The optical band gap can be obtained from the extrapolated line of the data plotted with respect to each film with a particular composition ratio. The optical band gap of ZnO is about 3.24 eV, and the optical band gap increases with increasing Mg content ratio. As the band gap increases, the electron affinity becomes small, so that the electron affinity can be controlled by changing the content ratio of Mg.

Figure 10:
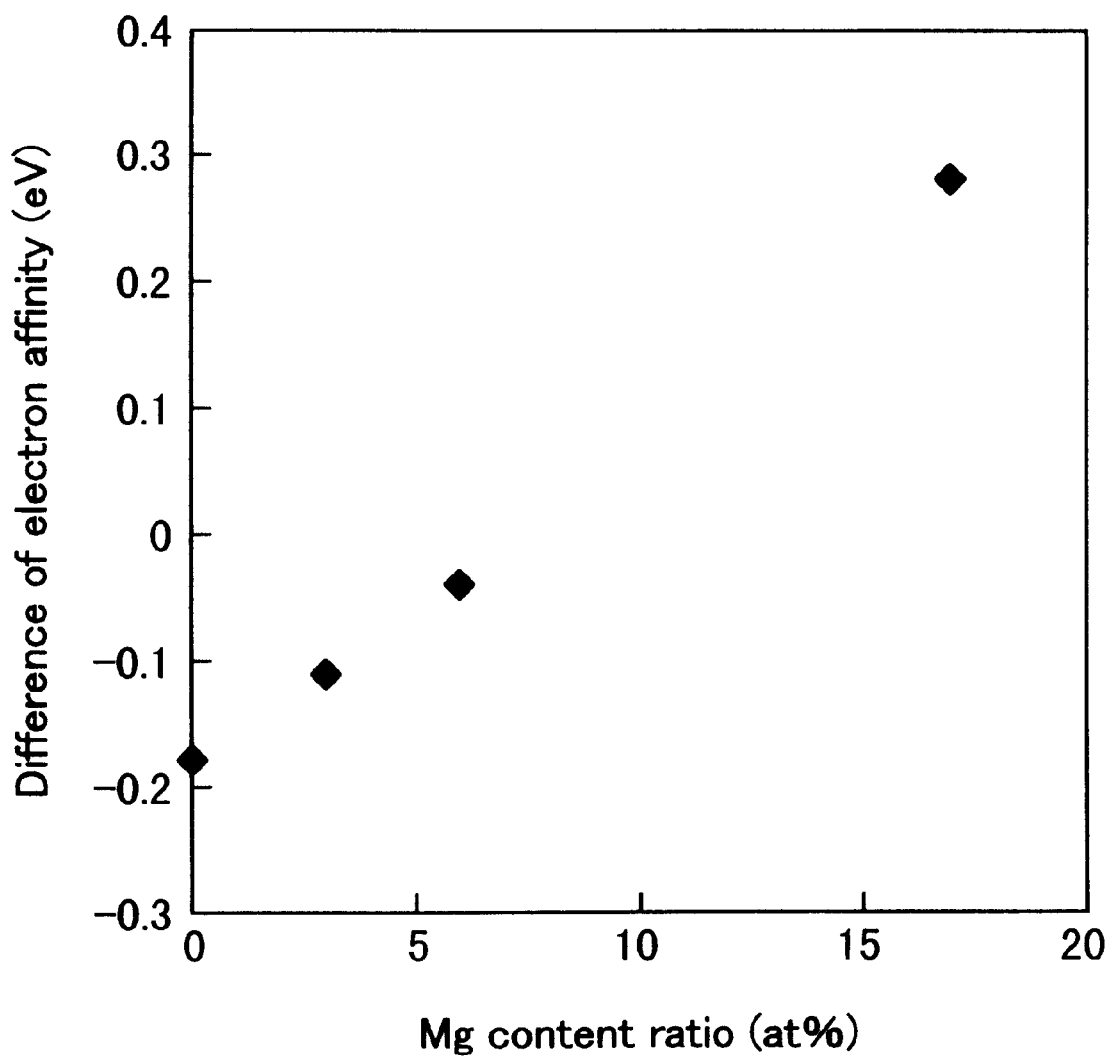
FIG. 10 is a graph showing changes in the difference between the electron affinity of a $Zn_{1-x}Mg_xO$ film and the electron affinity of a CIGS film when the content ratio of Mg in the $Zn_{1-x}Mg_xO$ film is changed.

A calculation was performed with respect to the changes in the difference between the electron affinity of the CIGS film and the electron affinity of the Zn$_{1-x}$Mg$_x$O film when the content ratio of Mg in the Zn$_{1-x}$Mg$_x$O film was changed. FIG. 10 shows the results of the calculation. The calculation was carried out in the following manner. First, with respect to each of the Zn$_{1-x}$Mg$_x$O film and the CIGS film, the difference ($E^{VBM}_{CL}$) between the core level of the film and the valence band maximum was measured by X-ray photoelectron spectroscopy (XPS). Then, the difference ($\Delta E_{CL}$) in the core level between the Zn$_{1-x}$Mg$_x$O film and the CIGS film was calculated from the results of the measurement. Then, substituting these values in equation (1) below derives the difference $\Delta E_V$ (valence band offset) in the level of the valence band between the Zn$_{1-x}$Mg$_x$O film and the CIGS film. Next, equation (2) derives the difference $\Delta E_C$ in the electron affinity between the Zn$_{1-x}$Mg$_x$O film and the CIGS film. The band gap Eg(ZnMgO) of the Zn$_{1-x}$Mg$_x$O film and the band gap Eg(CIGS) of the CIGS film can be measured from the light transmission characteristics or reflection characteristics and the changes in the quantum efficiency of the solar cell with respect to the wavelength of the incident light.

$$\Delta E_V = E^{VBM}_{CL}(CIGS) - E^{VBM}_{CL}(ZnMgO) - \Delta E_{CL} \quad (1)$$

$$\Delta E_C = Eg(ZnMgO) - Eg(CIGS) - \Delta E_V \quad (2)$$

Herein, a method for calculating the electron affinity by XPS measurement has been described. However, it also can be calculated by ultraviolet ray photoelectron spectroscopy (UPS). In the case where the UPS method is used, since the conduction band level can be measured, the difference in the electron affinity can be calculated directly Next, the characteristics of the solar cell with varied content ratios of Mg were examined.

In Example 2, an actually produced example of the solar cell 20 of Embodiment 2 will be described. The solar cell of Example 2 includes a Cu(In, Ga)Se$_2$ layer containing Cd as the surface semiconductor layer 13a on the surface of the semiconductor layer 13. Furthermore, in the solar cell of Example 2, a Zn$_{1-x}$Mg$_x$O film was used as the semiconductor layer 14 (window layer).

In Example 2, first, a Mo electrode film is formed on a glass substrate, and a Cu(In$_{0.08}$, Ga$_{0.2}$)Se$_2$ (CIGS) film as the semiconductor layer 13 (light-absorption layer) was formed thereon. The Mo film and the Cu(In, Ga)Se$_2$ film were formed in the following manner (see Japanese Journal of Applied Physics, vol. 34, L1141, 1995). First, the Mo film was formed by sputtering in an Ar gas atmosphere. The thickness of the film was about 1 $\mu$m. Then, the Cu(In, Ga)Se$_2$ film was formed by deposition with three stages. In the first stage, a (In, Ga)$_2$Se$_3$ film was formed at a substrate temperature of 350° C. on the Mo film. Then, in the second stage, the substrate temperature was raised to 500° C. or more so that Cu and Se were deposited to form a Cu(In, Ga)Se$_2$ film where the composition ratio of Cu is excessive. In the last stage, In, Ga and Se were deposited simultaneously so as to form a Cu(In, Ga)Se$_2$ film where the composition ratio of (In, Ga) was slightly in excess. The thickness of the Cu(In, Ga)Se$_2$ film was about 2 $\mu$m.

Next, a surface semiconductor layer made of Cu(In, Ga)Se$_2$ doped with Cd was formed on the surface of the CIGS film by immersing the CIGS film in an aqueous solution of cadmium nitrate and ammonia. Then, a Zn(O, S) film (10 nm thick) as the semiconductor layer 21 (buffer layer) was formed on the semiconductor layer 13 by chemical bath deposition. The electron affinity of this Zn(O, S) buffer film is at least 0.5 eV smaller than that of the CIGS film, and the conduction band level of the Zn(O, S) film is higher in the energy position than the CIGS film.

Thereafter, Zn$_{1-x}$Mg$_x$O films (0.1 $\mu$m thick) with varied content ratios of Mg were formed as the semiconductor layer 14 (window layer) on the Zn(O, S) film. The Zn$_{1-x}$Mg$_x$O film was formed in the above-described manner. Thereafter, an ITO film (0.1 $\mu$m thick) was formed as the upper electrode film 15 on the semiconductor layer 14 by sputtering. Furthermore, the interconnection electrode 17 and a MgF$_2$ (0.12 $\mu$m thick) as the anti-reflection film 16 were formed on the upper electrode film 15. Thus, the solar cell 20 was produced.

Figure 11:
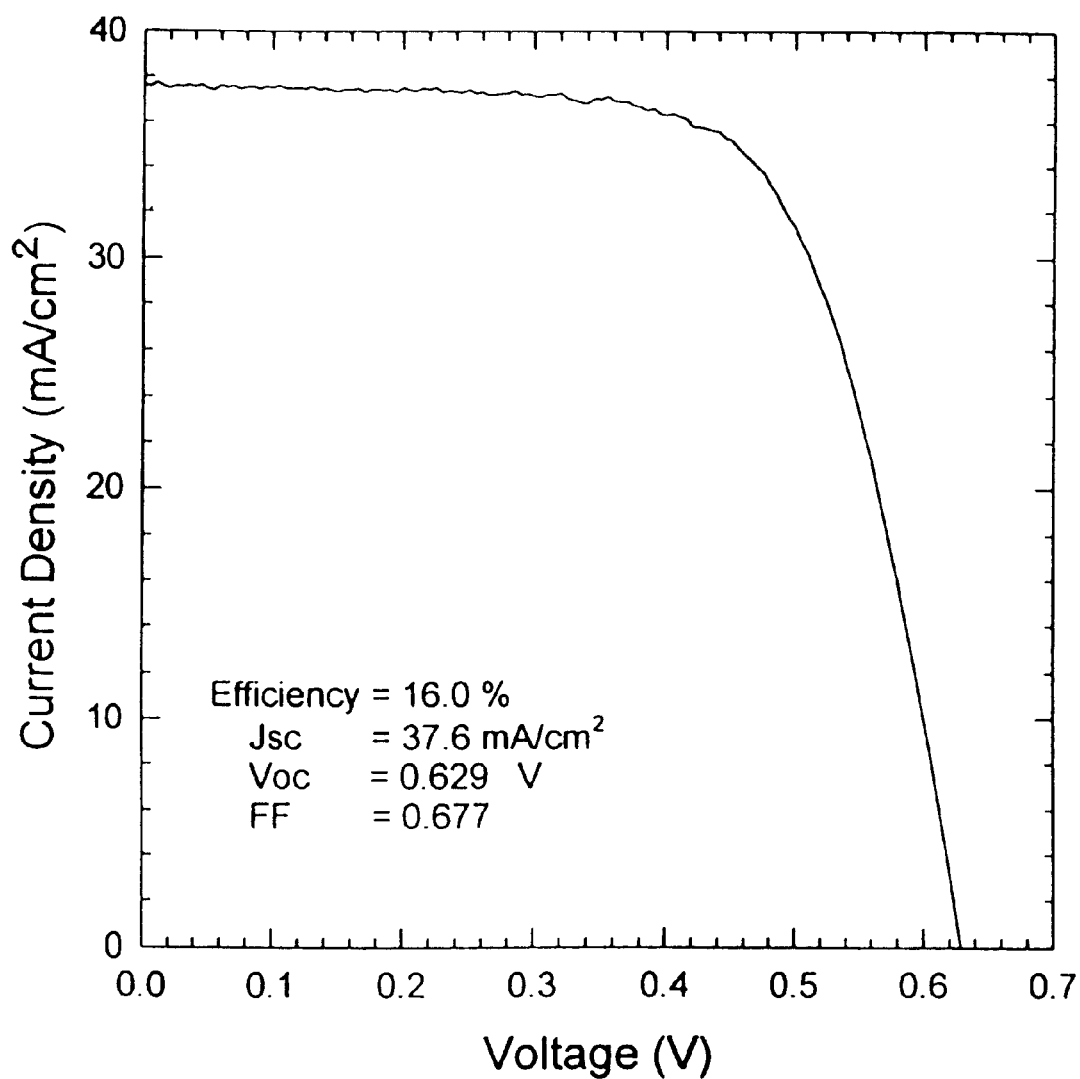
FIG. 11 is a graph showing the current-voltage characteristics of an example of the solar cell of the present invention.
Figure 12:
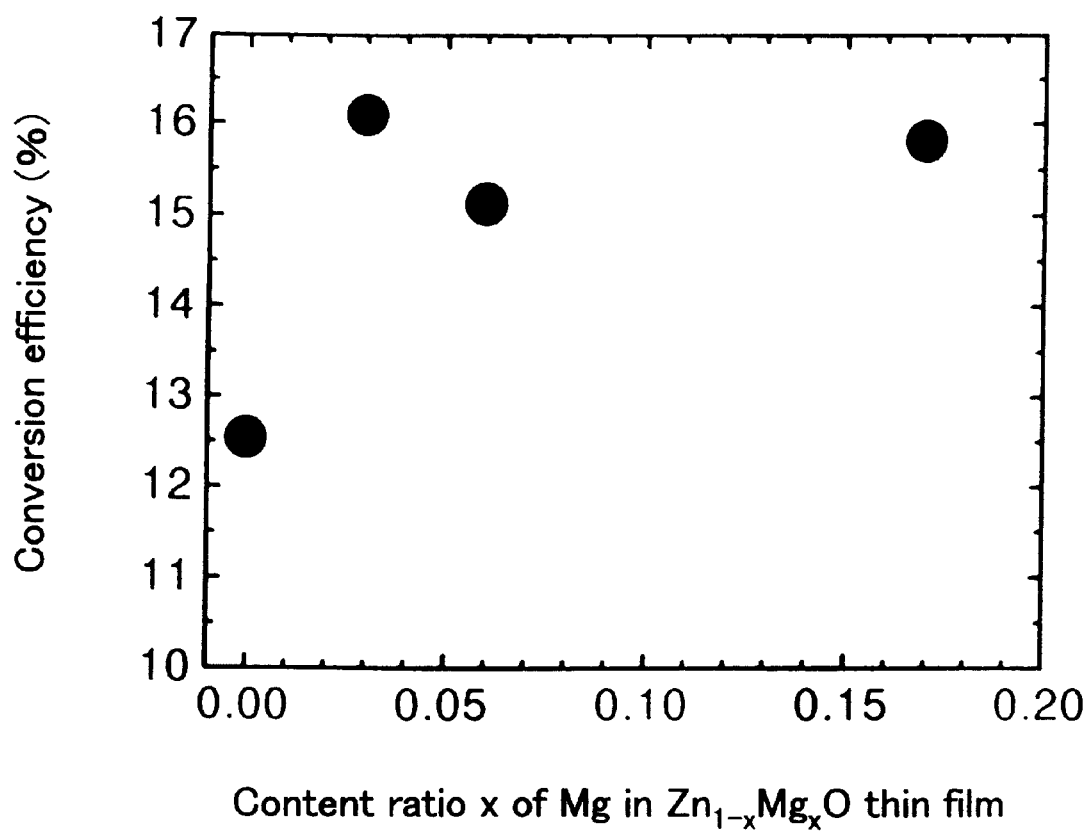
FIG. 12 is a graph showing changes in the conversion efficiency against changes in the Mg content ratio in the $Zn_{1-x}Mg_xO$ film.

FIG. 11 shows the current-voltage characteristics when X is 0.03, that is, the Zn$_{0.97}$Mg$_{0.3}$O film was used as the window layer. In this case, the conversion efficiency was 16.0%. This is substantially the same as the efficiency of the solar cell using a CdS film as the window layer. Next, FIG. 12 shows the changes in the conversion efficiency with respect to the content ratio of Mg. When Mg is added, the efficiency improves about 30% from that of the solar cell using ZnO alone. The difference ($\chi_2-\chi_1$) between the electron affinity $\chi_1$ (eV) of the ZnO used herein and the electron affinity $\chi_2$ (eV) of the CIGS film is about –0.1 (eV). Thus, since the conduction band level of the ZnO window layer is low, recombination increases at the interface between ZnO and Zn(O, S). Therefore, the conversion efficiency of the solar cell is reduced. On the other hand, when Mg is added, as shown in FIG. 9, the band gap increases, and the electron affinity decreases, so that the offset with the CIGS film ($\chi_2-\chi_1$) becomes positive, and the recombination rate at the interface is reduced. Thus, the conversion efficiency improves. In the solar cell of Example 2, the efficiency is not substantially changed even if the content ratio of Mg increases to the vicinity of 0.2. This is believed to be because the offset ($\chi_2-\chi_1$) is in the range of 0.5 eV or less. Thus, the conversion efficiency can be improved by using the Zn$_{1-x}$Mg$_x$O film with which the electron affinity can be controlled.

In Example 2, the Zn$_{1-x}$Mg$_x$O film was formed by cosputtering from two targets of ZnO and MgO. However, the Zn$_{1-x}$Mg$_x$O film can be formed by using a sintered target of (ZnO+MgO) comprising an arbitrary MgO that has been added previously. Furthermore, the same effects can be obtained even in the presence of impurities such as Al$_2$O$_3$ in a small amount that cannot change the crystal structure of ZnO in the Zn$_{1-x}$Mg$_x$O film. In this example, the Zn(O,S) film, which is a highly resistive n-type semiconductor was used as the semiconductor layer 21 (buffer layer) having a small electron affinity, but the same effects can be obtained with a ZnS film or the like having an offset with the CIGS film of 1.3 eV or more. Furthermore, in this example, the very thin n-type surface semiconductor layer that is doped with Cd is formed on the surface of the p-type CIGS film. However, even if this surface semiconductor layer is not formed, the solar cell of this example using the Zn$_{1-x}$Mg$_x$film as the window layer achieves higher efficiency than a conventional solar cell using a ZnO film.

Example 3

In Example 3, an actually produced example of the solar cell 10a of Embodiment 1 will be described. In Example 3, a glass substrate as the substrate 11, a Mo film as the lower electrode film 12, Cu(In, Ga)Se$_2$ as the semiconductor layer 13 (light-absorption layer), a Zn$_Y$Al$_{2-2Y}$O$_{3-2Y}$ film (0<Y<1) having a different electron affinity as the semiconductor layer 14 (window layer), ITO as the upper electrode film 15, and MgF$_2$ as the anti-reflection film 16 were used. A Cu(In, Ga)Se$_2$ film was formed as the surface semiconductor layer 13a on the surface of the semiconductor layer 13.

Figure 13:
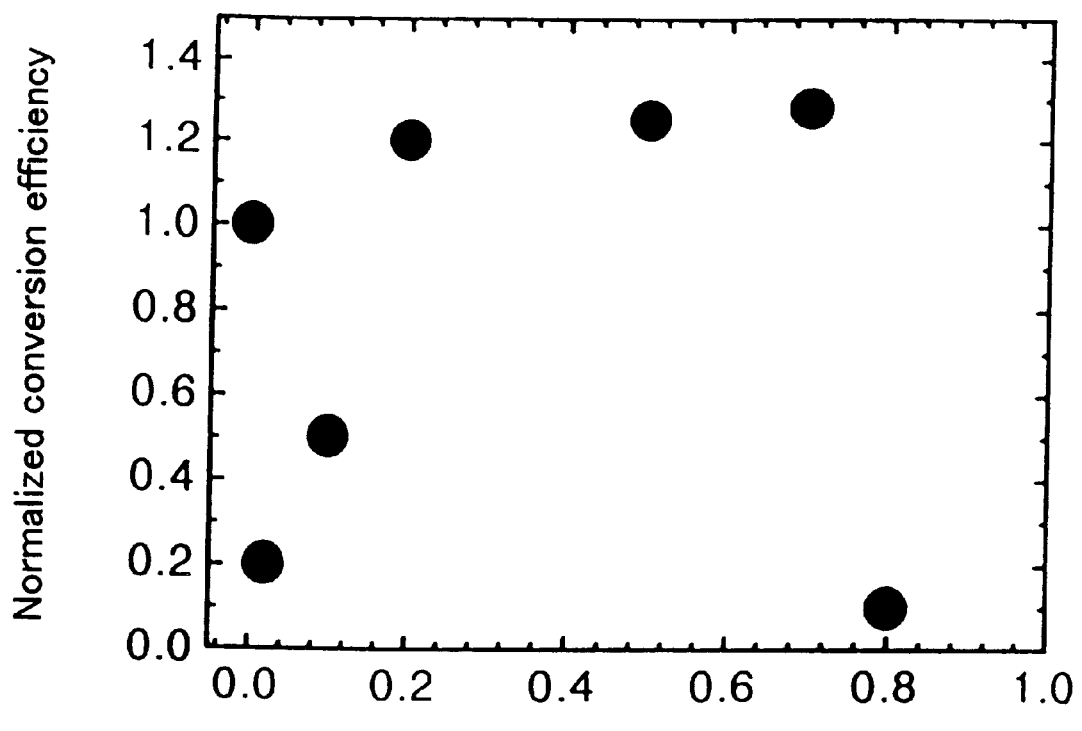
FIG. 13 is a graph showing changes in the normalized conversion efficiency when a value of Y in the $Zn_YAl_{2-2Y}O_{3-2Y}$ film is changed.

In the solar cell of Example 3, since the electron affinity of Al$_2$O$_3$ is smaller than that of ZnO, it is expected that the electron affinity can be controlled by adding Al$_2$O$_3$ to the ZnO film. The Zn$_Y$Al$_{2-2Y}$O$_{3-2Y}$ film was formed by cosputtering from two targets of ZnO and Al$_2$O$_3$. The composition ratio of Zn and Al was controlled by high frequency power applied to the two targets. FIG. 13 shows the changes in the conversion efficiency of the solar cell with respect to the Al content ratio. The conversion efficiency in the vertical axis in FIG. 13 is normalized with respect to the conversion efficiency hen ZnO is used. The conversion efficiency of a cell using the Zn$_Y$Al$_{2-2Y}$O$_{3-2Y}$ film is lower than that of a cell using the ZnO film without Al, until the ratio {Al/(Zn+Al)} by number of atoms in the Zn$_Y$Al$_{2-2Y}$O$_{3-2Y}$ film reaches 0.1. This is believed to be because the addition of a small amount of Al reduces the resistance of the Zn$_Y$Al$_{2-2Y}$O$_{3-2Y}$ film so that leakage current flows. Then, when {Al/(Zn+Al)} is from 0.2 to 0.7, the efficiency improves and is substantially constant. This is because when the amount of Al$_2$O$_3$ added increases, the electron affinity of the film becomes smaller than that of CIGS film. Then, when {Al/(Zn+Al)} is 0.7 or more, the efficiency decreases sharply. This is believed to be because the difference between the electron affinity $\chi_1$ of the Zn$_Y$Al$_{2-2Y}$O$_{3-2Y}$ film and electron affinity $\chi_2$ of the CIGS film becomes 0.5 eV or more, so that the $Zn_YAl_{2-2Y}O_{3-2Y}$ film becomes a barrier, and thus photoexcited carriers in the CIGS film cannot flow. Thus, it was found that the electron affinity of the $Zn_YAl_{2-2Y}O_{3-2Y}$ film can be controlled by changing the content ratio of Al, and the conversion efficiency can improve when {Al/(Zn+Al)} is in the range from 0.2 to 0.7.

Furthermore, since the electron affinity of the CIGS film is changed by changing the ratio (Ga/(In+Ga)) by number of atoms in the CIGS film, the range of the composition ratio of Al that improves the conversion efficiency is varied. In Example 3, the $Zn_YAl_{2-2Y}O_{3-2Y}$ film was used as the window layer. However, the same effects can be obtained with a material such as $Zn_YGa_{2-2Y}O_{3-2Y}$ (0<Y<1) where an element of group IIIb is used instead of Al. The optimal range of the composition ratio of the element of group IIIb for improvement of the conversion efficiency is varied with the element used.

Example 4

In Example 4, an actually produced example of the solar cell 30 of Embodiment 3 will be described. For the solar cell of Example 4, a glass substrate as the substrate 11, a Mo film as the lower electrode film 12, Cu(In, Ga)Se$_2$ as the semiconductor layer 13, a $Zn_{0.9}Mg_{0.1}O$ film as the semiconductor layer 14 (window layer), ITO as the upper electrode film 15, MgF$_2$ as the anti-reflection film 16 and an Al$_2$O$_3$ film as the insulating layer 31 (buffer layer) were used. A Cu(In, Ga)Se$_2$ film containing Cd was formed as the surface semiconductor layer 13a on the surface of the semiconductor layer 13.

Figure 14:
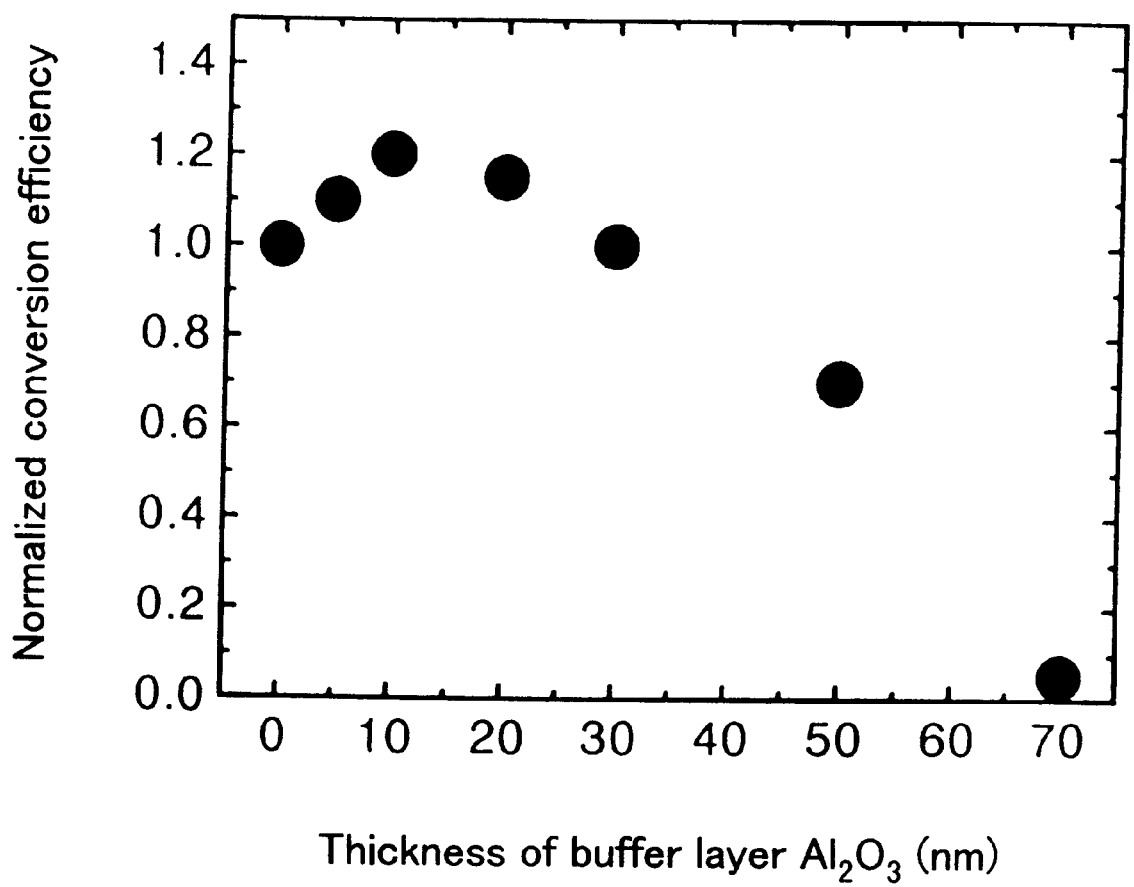
FIG. 14 is a graph showing changes in the normalized conversion efficiency when the thickness of an $Al_2O_3$ film, which is a buffer layer, is changed.

In this example, the difference ($\chi_2-\chi_1$) between the electron affinity $\chi_1$ of the semiconductor layer 14 (window layer) and the electron affinity $\chi_2$ of the semiconductor layer 13 (light-absorption layer) is in the range from 0 to 0.5 eV. Furthermore, the electron affinity $\chi_{INS}$ (eV) of the insulating layer 31 and the electron affinity $\chi_2$ (eV) satisfy the relationship ($\chi_2-\chi_{INS}$)≧0.5. The layers were formed in the same manner as in Example 2. The Al$_2$O$_3$ film was formed on the CIGS film by electron beam evaporation. FIG. 14 shows the changes of the conversion efficiency of the solar cell when the thickness of the Al$_2$O$_3$ film is changed. The conversion efficiency in the vertical axis is normalized with respect to the conversion efficiency when the thickness of the Al$_2$O$_3$ film is 0 (the Al$_2$O$_3$ film is not provided). The conversion efficiency is highest at the thickness of the Al$_2$O$_3$ film of about 10 nm, and then it decreases with increasing thickness. At thicknesses of 50 nm or more, the output was substantially reduced. The reason is as follows. First, it is believed that when the thickness of the Al$_2$O$_3$ film is smaller than 10 nm, the coating ratio of the Al$_2$O$_3$ film that coats the CIGS film is low, so that sputtering damage is caused on a portion of the surface of the CIGS film by collision of scattered accelerated particles or ionized gas molecular during formation of the $Zn_{1-x}Mg_xO$ film. Thus, it is believed that the defect density on the interface of the CIGS film increases so that the conversion efficiency decreases.

The conversion efficiency decreases at a thickness of the insulating layer larger than 10 nm, and decreases sharply at 50 nm or more for the following reasons. The insulating layer Al$_2$O$_3$ having a small electron affinity becomes a barrier of the pn junction formed by the CIGS film and the $Zn_{1-XMg_X}O$ film. However, when the film is thin, optical carriers tunnel through this barrier and flow to the n-type window layer. On the other hand, when the thickness of the film increases, the thickness of the barrier increases so that tunneling current is reduced drastically, and therefore the efficiency drops. Therefore, in the case where the insulating layer whose electron affinity is smaller than the electron affinity of the CIGS by 0.5 eV or more is used as the buffer layer, it is preferable that the thickness thereof is 50 nm or less and there is the optimal range of the thickness.

Furthermore, the same effects can be obtained even if the highly resistive semiconductor layer described in Example 2 (the semiconductor layer whose electron affinity is larger than the electron affinity of the light-absorption layer by 0.5 eV or more) is used instead of the insulating layer. Moreover, the same effects can be obtained when Ga$_2$O$_3$, Si$_3$N$_4$, SiO$_2$, MgF$_2$ or the like is used, instead of Al$_2$O$_3$, for the insulating layer.

Example 5

In Example 5, another example of the solar cell 20 of Embodiment 2 will be described. In the solar cell of Example 5, the changes of the conversion efficiency of the solar cell were measured when the semiconductor layer 14 (window layer) is fixed, and the electron affinity of the semiconductor layer 13 (light-absorption layer) is changed. For the solar cell of Example 5, a glass substrate as the substrate 11, a Mo film as the lower electrode film 12 a CuIn(Se$_{1-X}$S$_X$)$_2$ (0≦X≦1) containing S in the form of a solid solution as the semiconductor layer 13, a $Zn_{0.8}Mg_{0.2}O$ film as the semiconductor layer 14 (window layer), ITO as the upper electrode film 15, MgF$_2$ as the anti-reflection film 16 and a ZnS film (10 nm thick) as the semiconductor layer 21 (buffer layer) were used. A CuIn(Se$_{1-X}$S$_X$)$_2$ film containing Cd was formed as the surface semiconductor layer 13a on the surface of the semiconductor layer 13.

Figure 15:
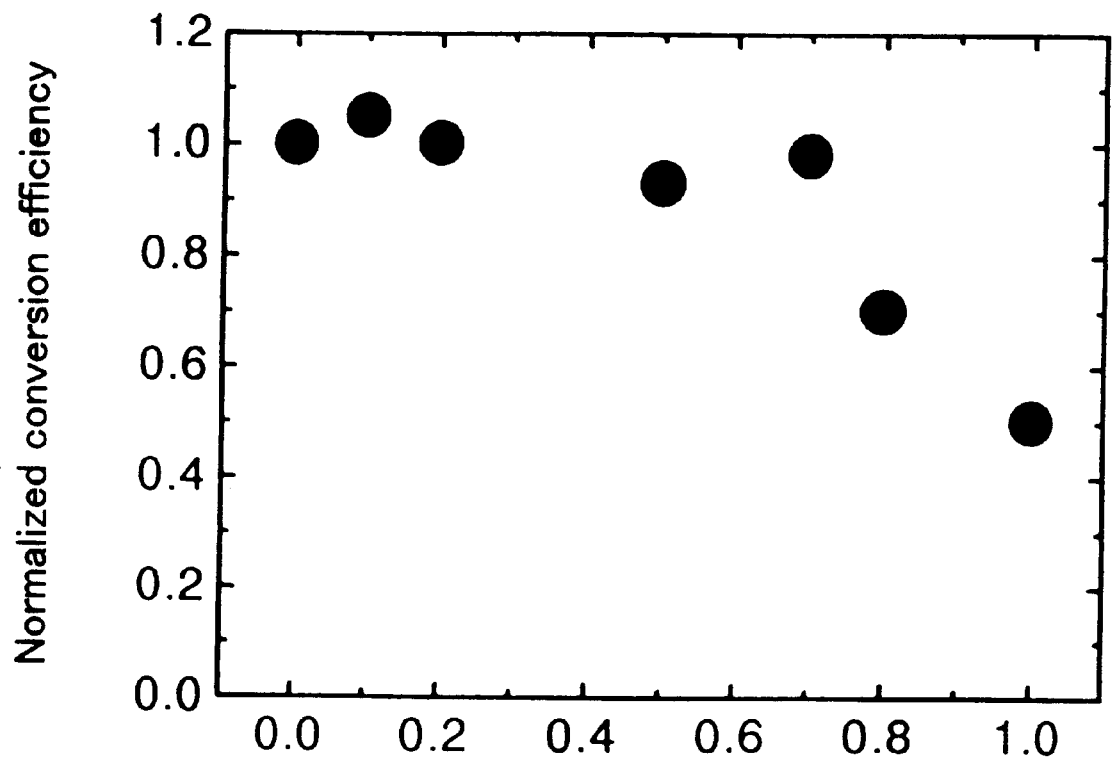
FIG. 15 is a graph showing changes in the normalized conversion efficiency when the solid solution ratio X of a $CuIn(Se_{1-x}S_x)_2$ film, which is a light-absorption layer, is changed.

CuInS$_2$ has an electron affinity about 0.4 eV smaller than that of CuInSe$_2$. Therefore, the electron affinity of the semiconductor layer 13 is changed by changing the solid solution ratio X of S. FIG. 15 shows the changes of the conversion efficiency with respect to the solid solution ratio X of S. The conversion efficiency in the vertical axis is normalized with respect to the conversion efficiency when the CuInSe$_2$ film is used (X=0).

As shown in FIG. 15, the conversion efficiency does not substantially change when the solid solution ratio X of S is from 0 to 0.8, whereas the efficiency decreases when X exceeds 0.8. This is believed to be caused for the following reasons. The electron affinity of the window layer, $Zn_{0.8}Mg_{0.2}O$ film is about 0.3 eV smaller than that of CuInSe$_2$. Therefore, when X is 0.8 or less, the electron affinity of the window layer and the electron affinity of the light-absorption layer satisfy the requirements of the solar cell of the present invention that achieves a high conversion efficiency. On the other hand, when the solid solution ratio X of S becomes large, the electron affinity of the CuIn(Se$_{1-X}$S$_X$)$_2$ film decreases. At this point, the efficiency does not change in the range where the electron affinity $\chi_1$ (eV) of the $Zn_{0.8}Mg_{0.2}O$ film and the electron affinity $\chi_2$ (eV) of the CuIn(Se$_{1-X}$S$_X$)$_2$ film satisfy the relationship 0≦$\chi_2-\chi_1$<0.5. However, when the solid solution ratio X of S further increases,($\chi_2-\chi_1$) becomes below 0 eV, so that the efficiency is strongly affected by recombination at the interface and drops. As seen from Examples 1 and 2, in the case where the electron affinity of the light-absorption layer becomes small, it is necessary to form a window layer having an electron affinity suitable for it. Thus, it is preferable to use the $Zn_{1-x}Mg_xO$ film that can control the electron affinity as the window layer.

In this example, the CuIn(Se$_{1-X}$S$_X$)$_2$ film is used as the light-absorption layer. However the same results can be obtained with a Cu(In$_{1-X}$ Ga$_X$)Se$_2$ (0≦X≦1) film. In this case, since the electron affinity of CuGaSe$_2$ film is about 0.6 eV smaller than that of CuInSe$_2$ film, the electron affinity is varied significantly with the solid solution ratio X of Ga. Even if X of the Cu(In$_{1-X}$Ga$_X$)Se$_2$ film is changed, high conversion efficiency can be obtained by using a window layer having an electron affinity suitable for it. Furthermore, in the Cu(In$_{1-X}$Ga$_X$)(Se$_{1-Y}$Sd$_Y$)$_2$ film, the electron affinity is changed by the solid solution ratio X of Ga and the solid solution ratio Y of S. However, high conversion efficiency can be obtained by providing a window layer having an electron affinity suitable for it. Moreover, even in a graded-type light-absorption layer where the solid solution ratio of Ga or the solid solution ratio of S is changed in the thickness direction, a conversion efficiency as high as above can be obtained by using a window layer having an electron affinity 0.5 eV smaller than that of the light-absorption layer in the depletion layer.

The preferred embodiments of the present invention have been described above. However, the present invention may be embodied in other forms without departing from the spirit or essential characteristics thereof For example, in the above-embodiments, a solar cell that generates electricity by light incident from the side opposite to the substrate has been illustrated. However, the solar cell can generate electricity by light incident from the side of the substrate.

The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solar cell comprising a first semiconductor layer that is n-type and a second semiconductor layer that is p-type, the first and second semiconductor layers forming a pn junction, wherein the first semiconductor layer is free from Cd, the second semiconductor layer is a light-absorption layer, a band gap Eg$_1$ of the first semiconductor layer and a band gap Eg$_2$ of the second semiconductor layer satisfy a relationship: Eg$_1$>Eg$_2$, and an electron affinity $\chi_1$ (eV) of the first semiconductor layer and an electron affinity $\chi_2$ (eV) of the second semiconductor layer satisfy a relationship: 0<($\chi_2-\chi_1$) <0.5.

2. The solar cell according to claim 1, wherein the first semiconductor layer is formed closer to a side from which light is incident than the second semiconductor layer.

3. The solar cell according to claim 1, further comprising a third semiconductor layer between the first semiconductor layer and the second semiconductor layer, wherein a band gap Eg$_3$ of the third semiconductor layer and the band gap Eg$_2$ satisfy a relationship: Eg$_3$>Eg$_2$.

4. The solar cell according to claim 3, wherein the third semiconductor layer is made of a semiconductor selected from the group consisting of an n-type semiconductor and a highly resistive semiconductor.

5. The solar cell according to claim 3, wherein an electron affinity $\chi_3$ (eV) of the third semiconductor layer and the electron affinity $\chi_2$ satisfy a relationship: ($\chi_2-\chi_3$)≧0.5, and a thickness of the third semiconductor layer is not more than 50 nm.

6. The solar cell according to claim 5, wherein the third semiconductor layer comprises an oxide comprising Zn and at least one element selected from group IIIb, or a chalcogenide comprising Zn and at least one element selected from group IIIb.

7. The solar cell according to claim 1, further comprising an insulating layer between the first semiconductor layer and the second semiconductor layer, wherein a band gap Eg$_{INS}$ of the insulating layer and the band gap Eg$_2$ satisfy a relationship Eg$_{INS}$>Eg$_2$.

8. The solar cell according to claim 7, wherein an electron affinity $\chi_{INS}$(eV) of the insulating layer and the electron affinity $\chi_2$ satisfy a relationship: ($\chi_2-\chi_{INS}$) ≧0.5, and a thickness of the insulating layer is not more than 50 nm.

9. The solar cell according to claim 8, wherein the insulating layer is made of at least one insulator selected from Al$_2$O$_3$, Ga$_2$O$_3$, Si$_3$N$_4$, SiO$_2$, MgF$_2$ and MgO.

10. The solar cell according to claim 1, wherein the second semiconductor layer further comprises an n-type semiconductor layer or a highly resistive semiconductor layer on a surface thereof on a side of the first semiconductor layer.

11. The solar cell according to claim 1, wherein the second semiconductor layer is a compound semiconductor layer comprising at least one element from each of groups Ib, IIIb, and VIb.

12. The solar cell according to claim 1, wherein the first semiconductor layer is made of a compound comprising Zn.

13. The solar cell according to claim 12, wherein the compound is an oxide comprising Zn and at least one element selected from group IIa, or a chalcogenide comprising Zn and at least one element selected from group IIa.

14. The solar cell according to claim 12, wherein the compound comprises an oxide expressed by a general formula Zn$_{1-X}$A$_X$O where element A is at least one selected from Be, Mg, Ca, Sr and Ba, and 0<X<1 as a main component.

15. The solar cell according to claim 14, wherein the element A is Mg, and the X satisfies a relationship: 0<X<0.5.

16. The solar cell according to claim 12, wherein the compound is an oxide comprising Zn and at least one element selected from group IIIb or a chalcogenide comprising Zn and at least one element selected from group IIIb.

17. The solar cell according to claim 12, wherein the compound comprises an oxide expressed by a general formula Zn$_Y$B$_{2-2Y}$O$_{3-2Y}$ where element B is at least one selected from Al, Ga and In, and 0<Y<1 as a main component.

18. A solar cell comprising a p-type light-absorption layer an n-type semiconductor layer stacked over the light-absorption layer, wherein the semiconductor layer comprises an oxide expressed by a general formula Zn$_{1-z}$C$_z$O where element C is at least one selected from Be, Mg, Ca, Sr and Ba, and 0<Z<1 as a main component.

19. The solar cell according to claim 18, wherein the element C is Mg, and the Z satisfies a relationship: 0<Z<0.5.

* * * * *